US008573755B2

(12) United States Patent
Nawano

(10) Patent No.: US 8,573,755 B2
(45) Date of Patent: *Nov. 5, 2013

(54) LIQUID-EJECTING HEAD, LIQUID-EJECTING APPARATUS, AND PIEZOELECTRIC ELEMENT

(75) Inventor: Masahisa Nawano, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/983,838

(22) Filed: Jan. 3, 2011

(65) Prior Publication Data

US 2011/0164096 A1 Jul. 7, 2011

(30) Foreign Application Priority Data

Jan. 5, 2010 (JP) ................. 2010-000829

(51) Int. Cl.
*B41J 2/045* (2006.01)
(52) U.S. Cl.
USPC ............................................ 347/71; 310/365
(58) Field of Classification Search
USPC .............................................. 347/68, 70–72
See application file for complete search history.

(56) References Cited

U.S. PATENT DOCUMENTS

| 5,350,721 | A | 9/1994 | Abe et al. |
|---|---|---|---|
| 5,453,262 | A | 9/1995 | Dawson et al. |
| 6,844,659 | B2 | 1/2005 | Ikeda et al. |
| 6,969,157 | B2 | 11/2005 | Tomozawa et al. |
| 7,498,725 | B2 | 3/2009 | Iezumi et al. |
| 7,589,450 | B2 | 9/2009 | Takabe et al. |
| 2005/0224851 | A1 | 10/2005 | Nakazawa |
| 2006/0170736 | A1 | 8/2006 | Tomozawa et al. |
| 2008/0265718 | A1 | 10/2008 | Sakashita et al. |
| 2008/0278038 | A1 | 11/2008 | Kobayashi et al. |
| 2008/0302658 | A1 | 12/2008 | Sasaki et al. |
| 2009/0230211 | A1 | 9/2009 | Kobayashi et al. |
| 2009/0243438 | A1 | 10/2009 | Hamada et al. |
| 2009/0273651 | A1 | 11/2009 | Kazama et al. |
| 2010/0214372 | A1 | 8/2010 | Takabe |
| 2011/0006243 | A1 | 1/2011 | Sasaki et al. |
| 2011/0102514 | A1 | 5/2011 | Yonemura |
| 2011/0102517 | A1* | 5/2011 | Yonemura et al. .............. 347/71 |

(Continued)

FOREIGN PATENT DOCUMENTS

| CN | 1461703 A | 12/2003 |
|---|---|---|
| CN | 101190846 A | 6/2008 |

(Continued)

OTHER PUBLICATIONS

Zhang, Shan-Tao, Preparation, structures, and multiferroic properties of single phase Bi1 -xLaxFeO3 (x=0-0.40) ceramics, J. Appl. Phys. 100, 114108 (2006), Paragraph 1.

(Continued)

*Primary Examiner* — Lisa M Solomon
(74) *Attorney, Agent, or Firm* — Kilpatrick Townsend & Stockton LLP

(57) ABSTRACT

A piezoelectric element comprising a first electrode, a piezoelectric layer which includes bismuth, lanthanum iron, and manganese and which formed above the first electrode and a second electrode formed above the piezoelectric layer. The integrated intensity of a diffraction peak observed at $20°<2\theta<25°$ is 90% or more of the sum of the integrated intensities of diffraction peaks observed at $20°<2\theta<50°$ in an X-ray powder diffraction pattern of the piezoelectric layer measured at $\phi=\Phi=0°$.

9 Claims, 21 Drawing Sheets

(56) References Cited

U.S. PATENT DOCUMENTS

| | | |
|---|---|---|
| 2011/0102518 A1 | 5/2011 | Yonemura et al. |
| 2011/0109704 A1* | 5/2011 | Furuya et al. .................. 347/71 |
| 2011/0164095 A1* | 7/2011 | Nawano et al. ................ 347/71 |
| 2011/0164097 A1 | 7/2011 | Nawano et al. |
| 2011/0164098 A1 | 7/2011 | Kobayashi et al. |
| 2011/0216135 A1 | 9/2011 | Yonemura |
| 2011/0221833 A1 | 9/2011 | Yonemura et al. |

FOREIGN PATENT DOCUMENTS

| | | |
|---|---|---|
| EP | 1 741 557 A2 | 1/2007 |
| EP | 2145975 A2 | 1/2010 |
| JP | 2001-223404 A | 8/2001 |
| JP | 2007-287744 A | 11/2007 |
| JP | 2009-070926 A | 4/2009 |
| JP | 2009-071144 A | 4/2009 |
| JP | 2009-113419 A | 5/2009 |
| JP | 2009-231482 A | 10/2009 |
| JP | 2009-242229 A | 10/2009 |
| JP | 2009-252789 A | 10/2009 |
| JP | 2009-252790 A | 1/2010 |
| JP | 2010-016010 A | 1/2010 |
| JP | 2010-016011 A | 3/2010 |
| JP | 2010-067756 A | 4/2010 |
| JP | 2010-080733 A | 4/2010 |

OTHER PUBLICATIONS

Singh, S.K., Room temperature ferroelectric properties of Mn-substituted BiFe03 thin films deposited on Pt electrodes using chemical solution deposition, Appl. Phys. Lett. 88, 262908 (2006), Paragraphs 3-4.

EESR mailed on Jun. 20, 2011 in European Patent Application No. 11157439.8, for Seiko Epson Corporation.

* cited by examiner

LIQUID-EJECTING HEAD, LIQUID-EJECTING APPARATUS, AND PIEZOELECTRIC ELEMENT

CROSS-REFERENCE TO RELATED APPLICATIONS

This application claims the benefit of priority to Japanese Patent Application No. 2010-000829 filed Jan. 5, 2010, the contents of which are hereby incorporated by reference in their entirety.

BACKGROUND

1. Technical Field

The present invention relates to a piezoelectric element, a liquid-ejecting head including the piezoelectric element, and a liquid-ejecting apparatus including the piezoelectric element. The piezoelectric element includes a piezoelectric layer and electrodes through which a voltage is applied to the piezoelectric layer. The piezoelectric element produces a pressure change in a pressure-generating chamber in communication with a nozzle opening.

2. Related Art

One example of piezoelectric elements for use in liquid-ejecting heads includes a piezoelectric layer between two electrodes. The piezoelectric layer is formed of a piezoelectric material having an electromechanical transfer function, such as a crystallized dielectric material. Such a piezoelectric element can be mounted on a liquid-ejecting head as an actuator in a flexural vibration mode. One representative example of liquid-ejecting heads is an ink jet print head. The ink jet print head has a diaphragm as part of a pressure-generating chamber, which communicates with a nozzle opening for ejecting ink droplets. The diaphragm is deformed by a piezoelectric element to pressurize ink in the pressure-generating chamber, thereby ejecting ink droplets from the nozzle opening. A piezoelectric element for use in such an ink jet print head can be manufactured by forming a uniform piezoelectric layer over the entire surface of a diaphragm by a film-forming technique and dividing the piezoelectric layer by lithography into pieces corresponding to each individual pressure-generating chamber.

Examples of the piezoelectric material for such a piezoelectric element include, but are not limited to, lead zirconate titanate (PZT) (JP-A-2001-223404).

However, lead zirconate titanate (PZT) contains lead. Thus, from the standpoint of environmental protection, there is a demand for a piezoelectric material of a lead-free ferroelectric substance. Examples of the lead-free piezoelectric material include, but are not limited to, $BiFeO_3$, which has a perovskite structure $ABO_3$. However, $BiFeO_3$-based piezoelectric materials have low insulating capacity and sometimes generate leakage current. Although commonly used lead zirconate titanate has been modified to improve its characteristics, the behavior of $BiFeO_3$-based piezoelectric materials is unknown. These problems are not confined to liquid-ejecting heads, including ink jet print heads, and also occur in piezoelectric elements, such as actuators, contained in other apparatuses.

SUMMARY

An advantage of some aspects of the invention is that it provides a lead-free piezoelectric element, a liquid-ejecting head including the lead-free piezoelectric element, and a liquid-ejecting apparatus including the lead-free piezoelectric element.

In accordance with one aspect of the invention to solve the problems described above, a liquid-ejecting head includes a pressure-generating chamber and a piezoelectric element. The pressure-generating chamber communicates with a nozzle opening. The piezoelectric element includes a first electrode, a piezoelectric layer containing bismuth lanthanum iron-manganese oxide disposed on the first electrode, and a second electrode disposed on the first electrode of the piezoelectric layer. The integrated intensity of a diffraction peak observed at $20°<2\theta<25°$ is 90% or more of the sum of the integrated intensities of diffraction peaks observed at $20°<2\theta<50°$ in an X-ray powder diffraction pattern of the piezoelectric layer measured at $\phi=\Phi=0°$. Since the liquid-ejecting head includes the piezoelectric element including the lead-free piezoelectric layer containing bismuth lanthanum iron-manganese oxide, the liquid-ejecting head has excellent deformation characteristics.

Preferably, the first electrode includes a first titanium oxide layer containing titanium oxide, a platinum layer containing platinum disposed on the first titanium oxide layer, and a second titanium oxide layer containing titanium oxide disposed on the platinum layer, and the piezoelectric layer is disposed on the second titanium oxide layer. This facilitates the formation of a piezoelectric layer containing bismuth lanthanum iron-manganese oxide in which crystals are preferentially oriented in a (100) plane. The phrase "preferentially oriented in a (100) plane", as used herein, includes both cases where all the crystals are oriented in the (100) plane and almost all the crystals (for example, 90% or more) are oriented in the (100) plane.

Preferably, the first electrode includes a platinum layer containing platinum and a lanthanum nickel oxide (LNO) layer containing lanthanum nickel oxide disposed on the platinum layer, the LNO layer having a thickness of 50 nm or more, and the piezoelectric layer is disposed on the LNO layer. Thus, the piezoelectric layer containing bismuth lanthanum iron-manganese oxide in which crystals are preferentially oriented in the (100) plane can be easily formed on the first electrode, which includes the platinum layer and the LNO layer.

Preferably, the bismuth lanthanum iron-manganese oxide is a complex oxide having a general formula (1) described below. Since the complex oxide having the general formula (1) can have the characteristics of a ferroelectric substance, the liquid-ejecting head can include a lead-free piezoelectric element the strain of which is easy to control. Thus, the liquid-ejecting head can include a piezoelectric element that can easily control the size of droplets ejected.

$$(Bi_{1-x}La_x)(Fe_{1-y}Mn_y)O_3 \quad (1)$$

$(0.10 \leq x \leq 0.20, 0.01 \leq y \leq 0.09)$

In the general formula (1), x is preferably in the range of $0.17 \leq x \leq 0.20$, more preferably $0.19 \leq x \leq 0.20$, and y is preferably in the range of $0.01 \leq y \leq 0.05$. The piezoelectric element satisfying these conditions can have a large strain.

In accordance with another aspect of the invention, a liquid-ejecting apparatus includes such a liquid-ejecting head as described above. In accordance with this aspect, since the liquid-ejecting head includes a lead-free piezoelectric element having excellent deformation characteristics, the liquid-ejecting apparatus does not adversely affect the environment and has high reliability.

A piezoelectric element according to an aspect of the invention includes a piezoelectric layer containing bismuth lanthanum iron-manganese oxide, and an electrode disposed on the piezoelectric layer, wherein the integrated intensity of a diffraction peak observed at $20°<2\theta<25°$ is 90% or more of the sum of the integrated intensities of diffraction peaks observed at $20°<2\theta<50°$ in an X-ray powder diffraction pattern of the piezoelectric layer measured at $\phi=\Phi=0°$. Thus, the piezoelectric element is free of lead and has excellent piezoelectricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
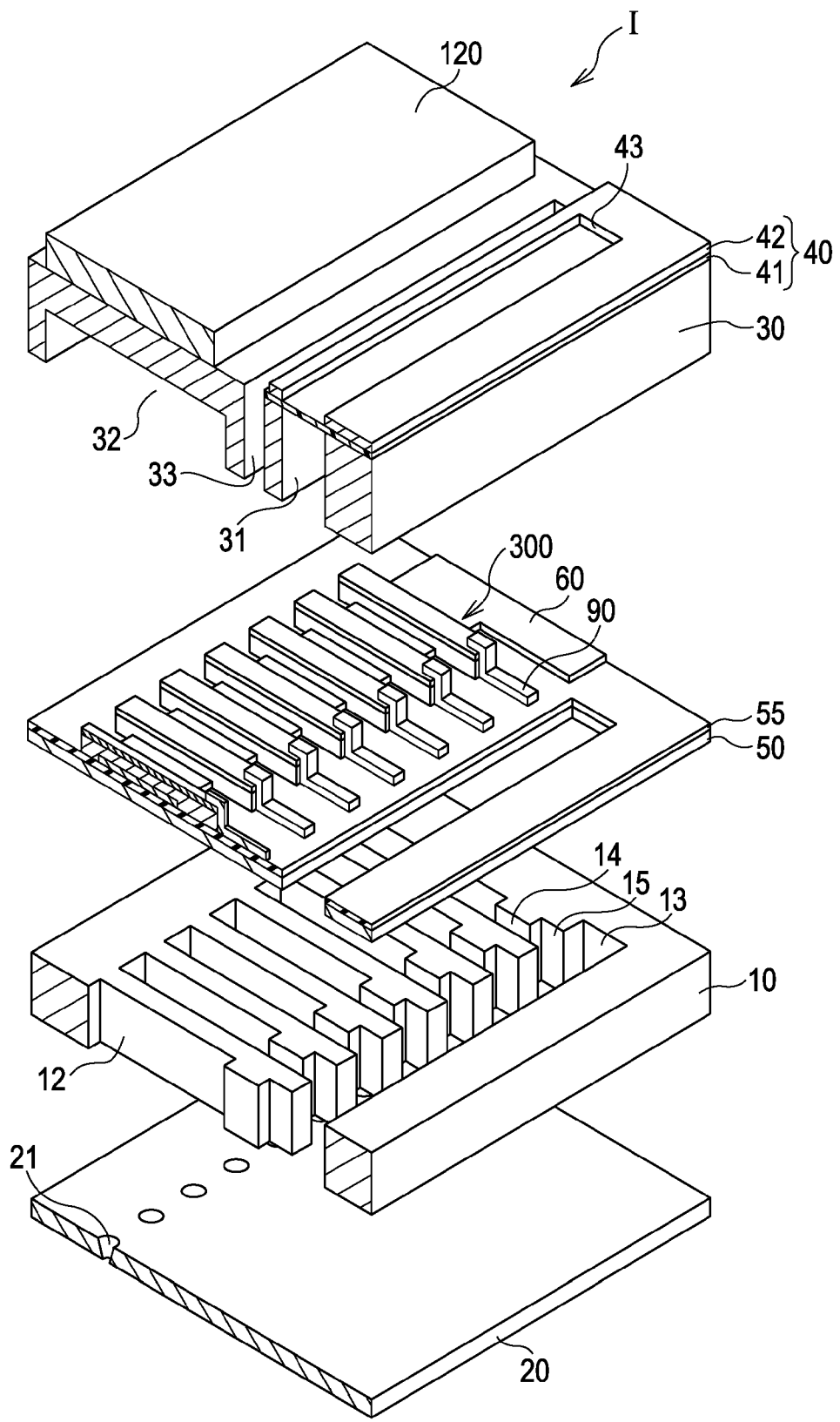
FIG. 1 is a schematic exploded perspective view of a print head according to a first embodiment of the invention.
Figure 2:
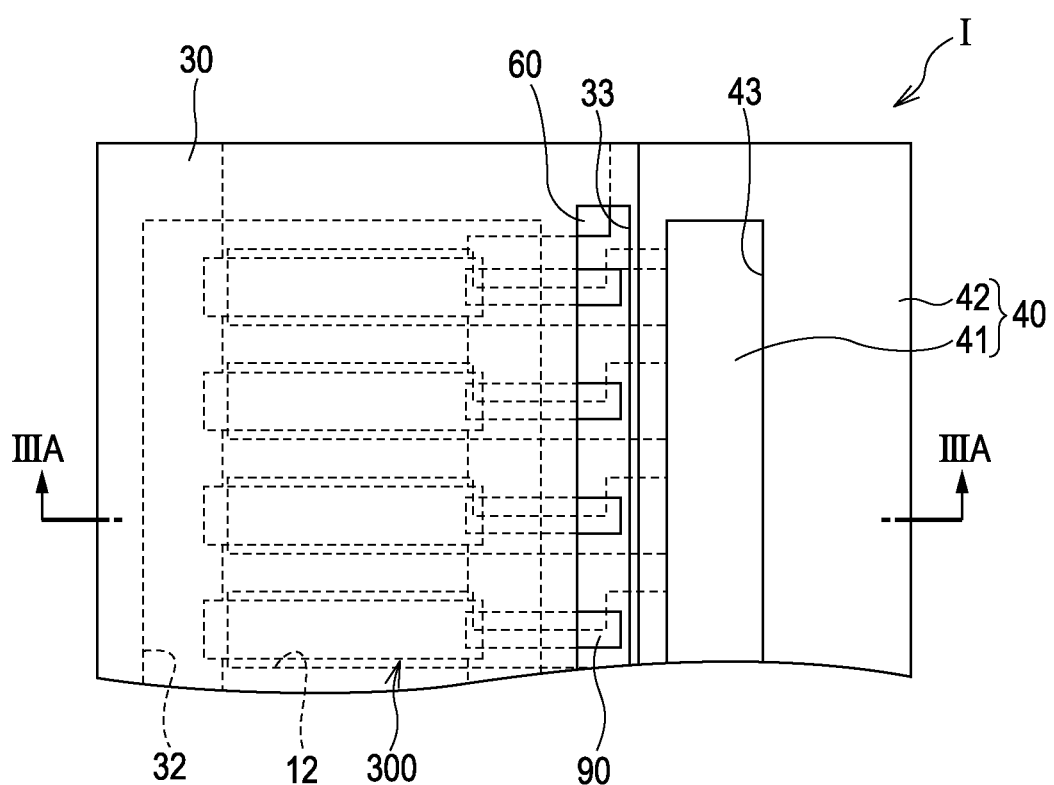
FIG. 2 is a fragmentary plan view of the print head according to the first embodiment of the invention.
Figure 3A:
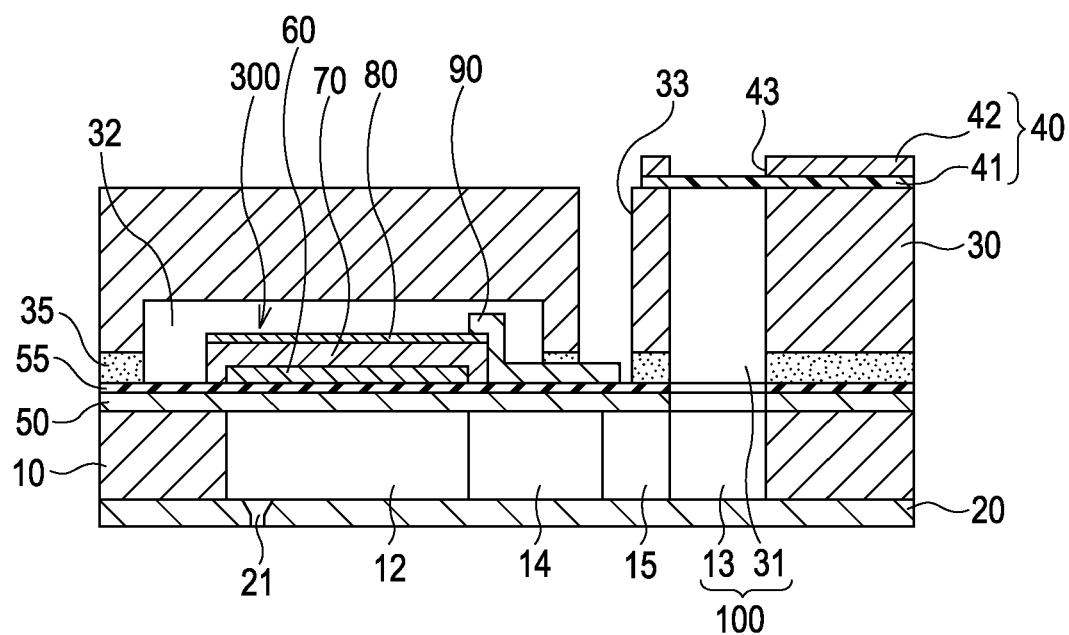
FIG. 3A is a cross-sectional view of the print head according to the first embodiment.
Figure 3B:
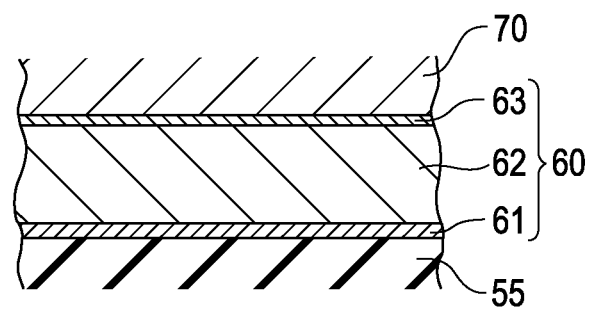
FIG. 3B is an enlarged cross-sectional view of a principal part of the print head according to the first embodiment.
Figure 4:
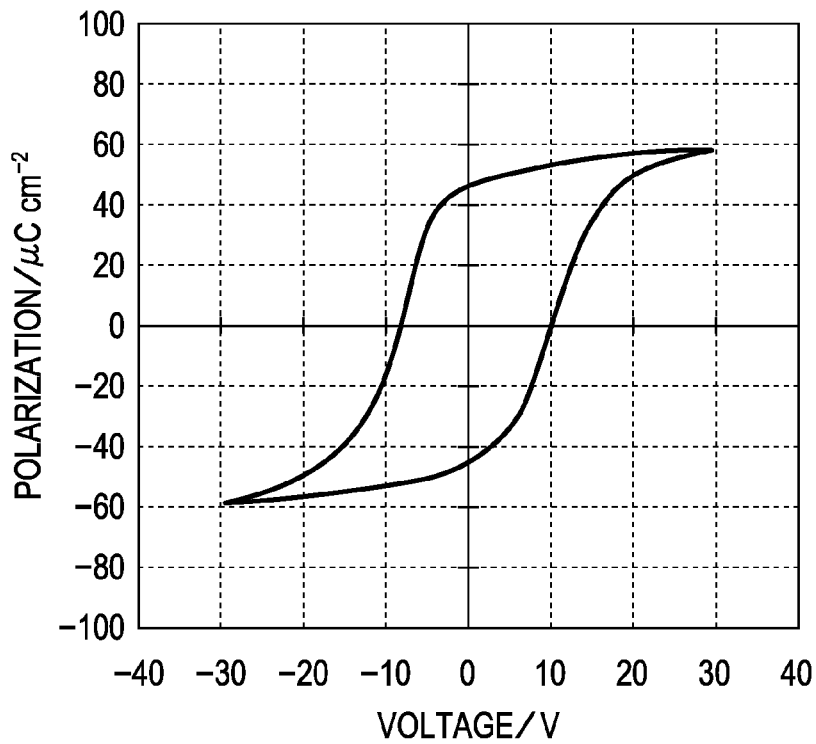
FIG. 4 is a graph showing a P-V curve of a sample 1.
Figure 5:
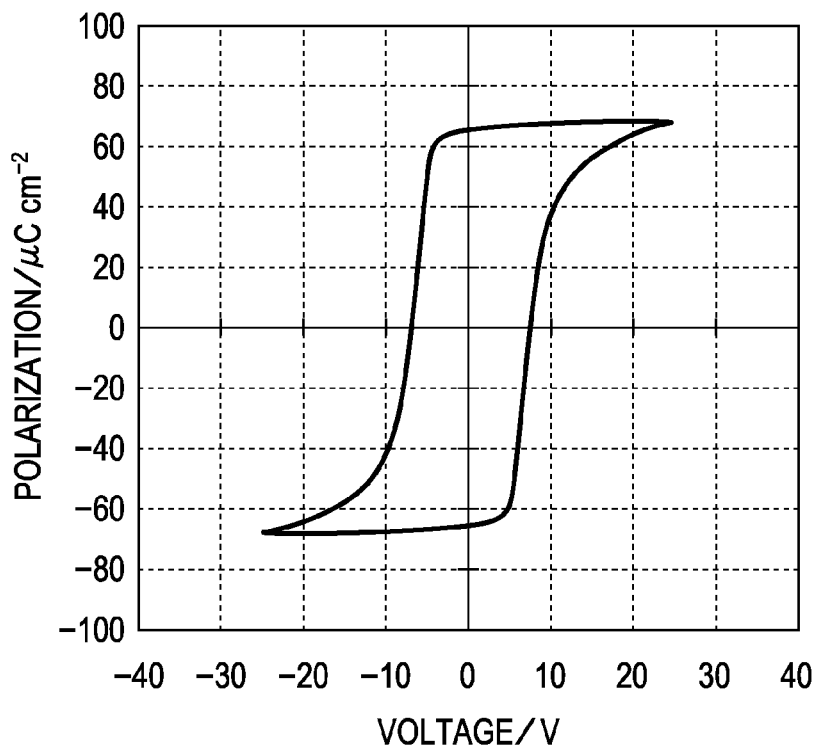
FIG. 5 is a graph showing a P-V curve of a sample 2.
Figure 6:
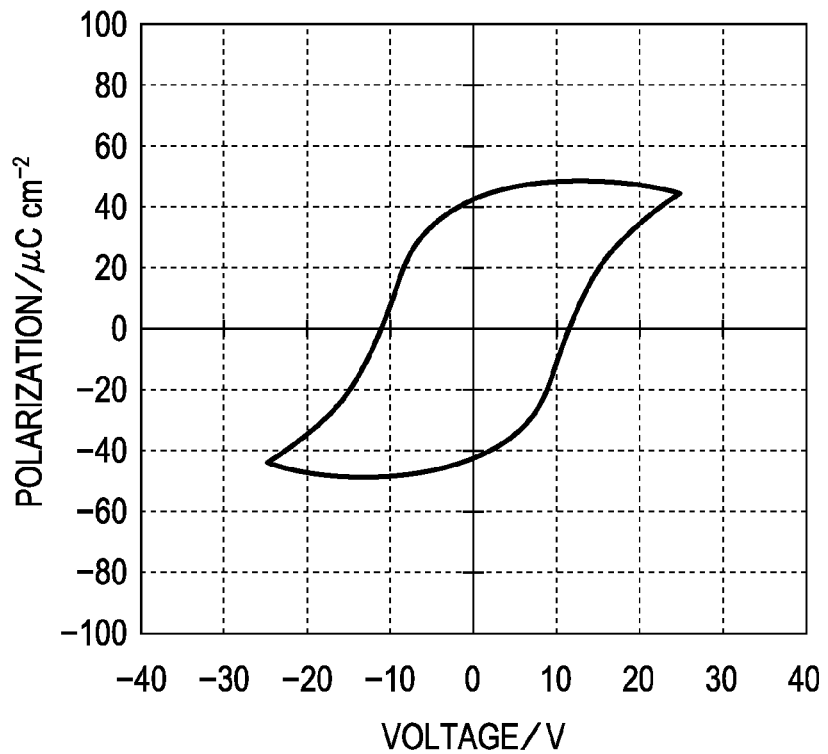
FIG. 6 is a graph showing a P-V curve of a sample 3.
Figure 7:
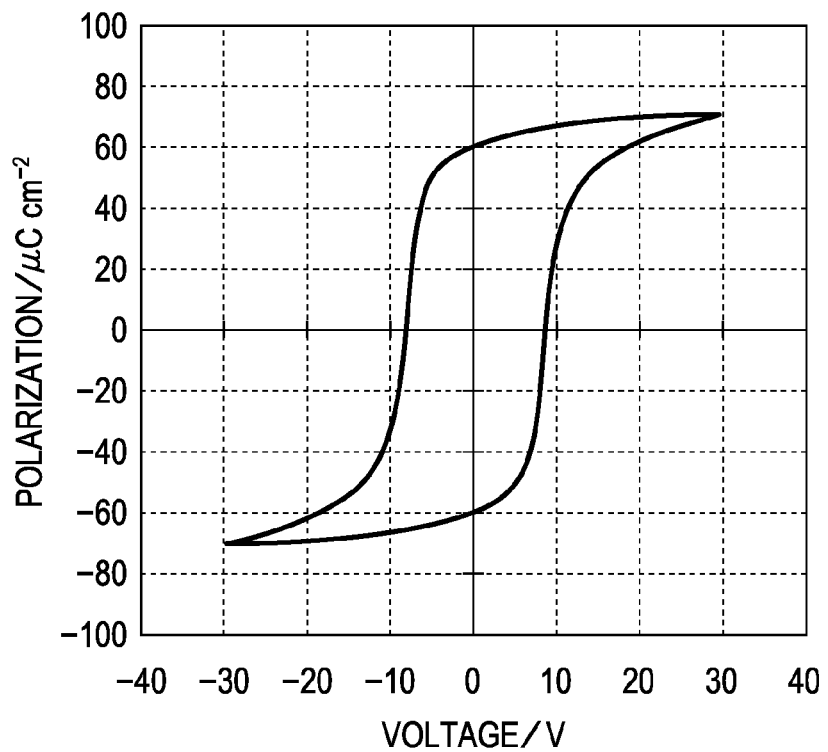
FIG. 7 is a graph showing a P-V curve of a sample 4.
Figure 8:
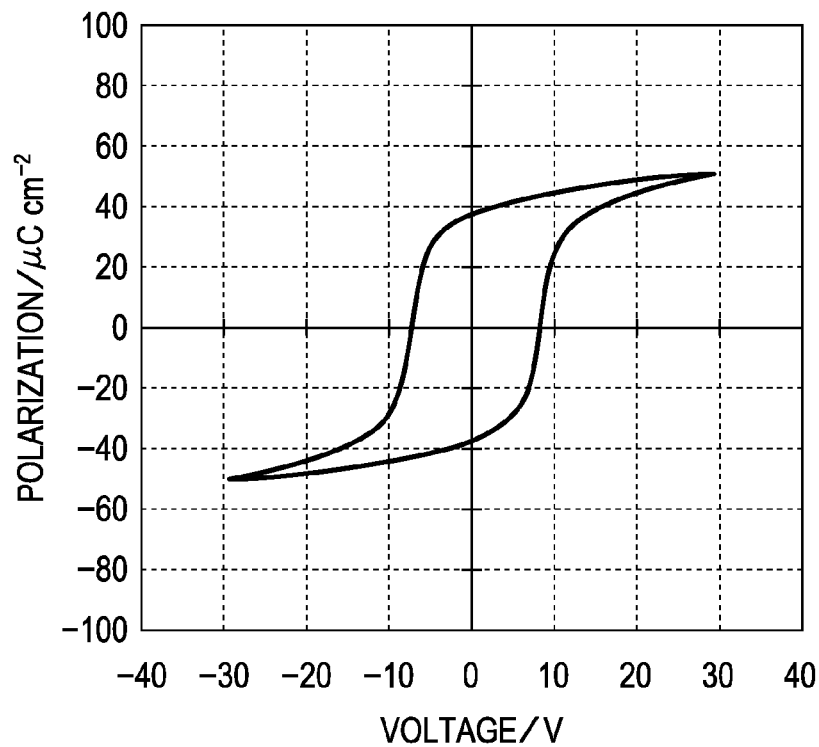
FIG. 8 is a graph showing a P-V curve of a sample 5.
Figure 9:
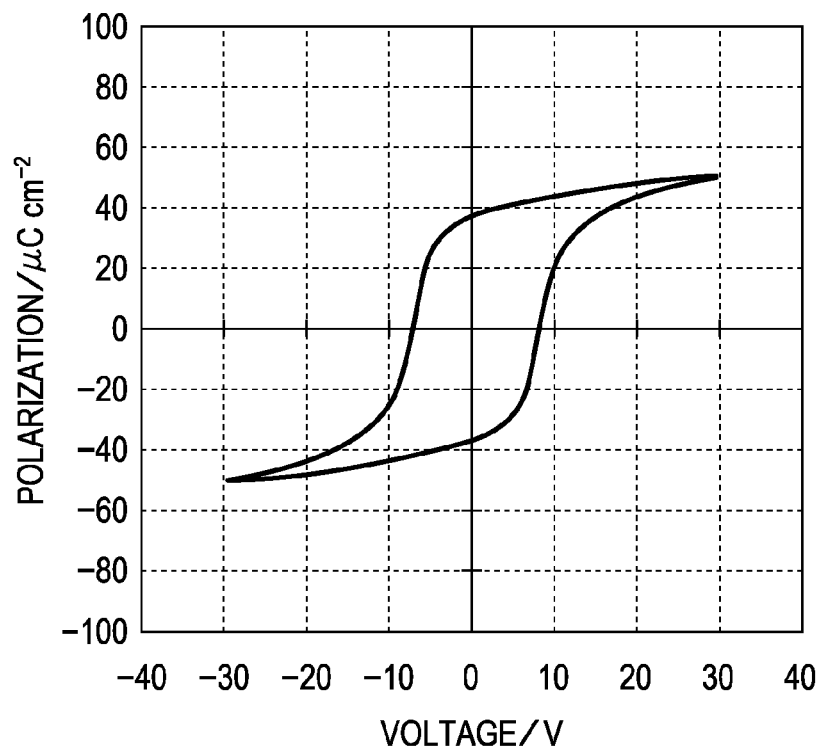
FIG. 9 is a graph showing a P-V curve of a sample 6.
Figure 10:
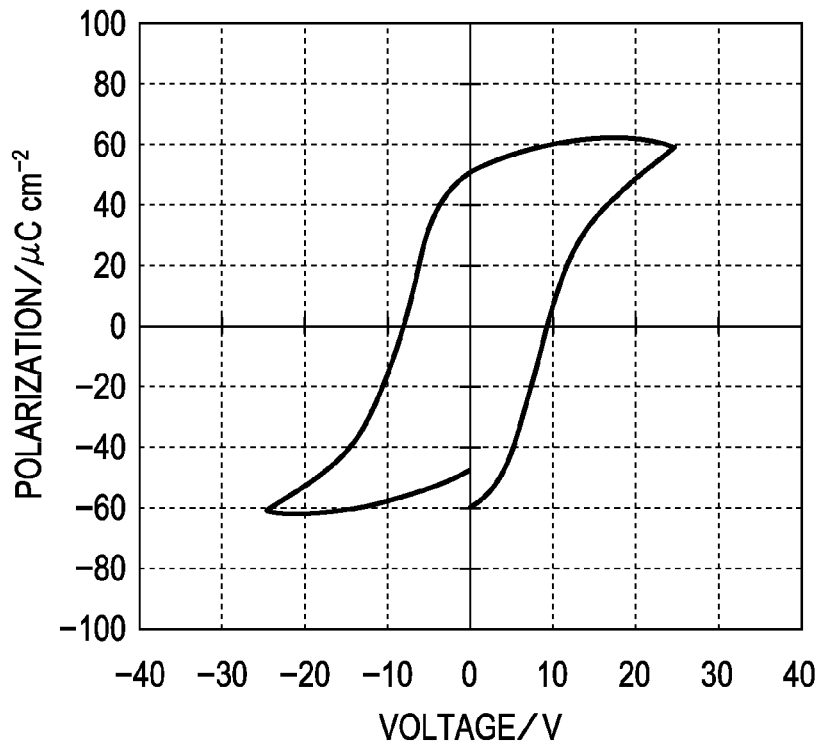
FIG. 10 is a graph showing a P-V curve of a sample 7.
Figure 11:
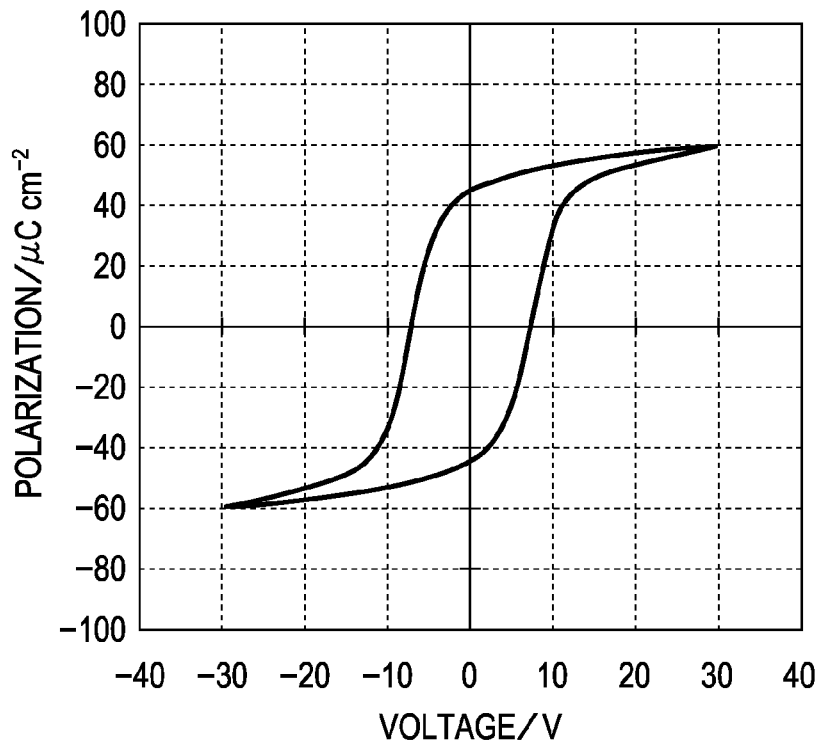
FIG. 11 is a graph showing a P-V curve of a sample 8.
Figure 12:
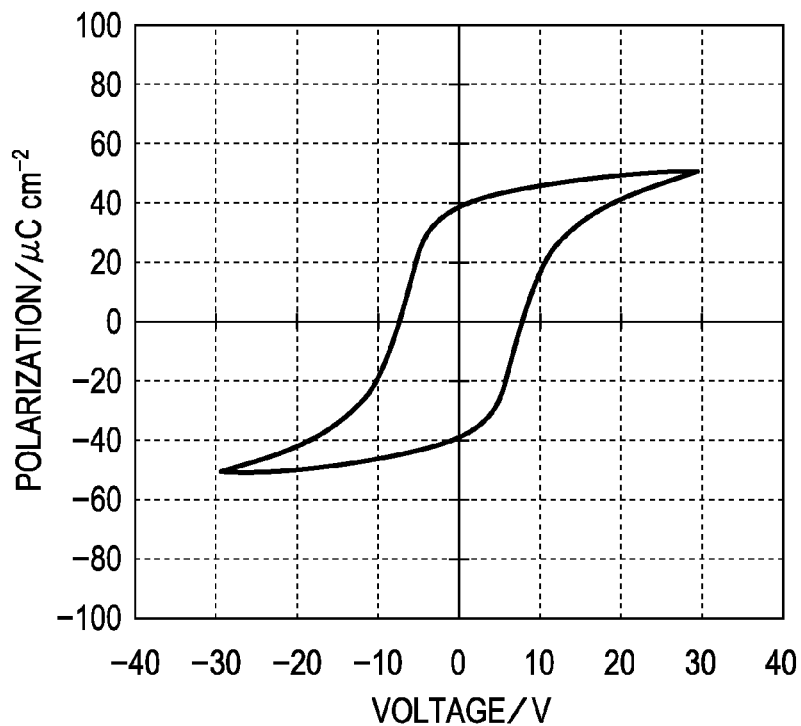
FIG. 12 is a graph showing a P-V curve of a sample 9.
Figure 13:
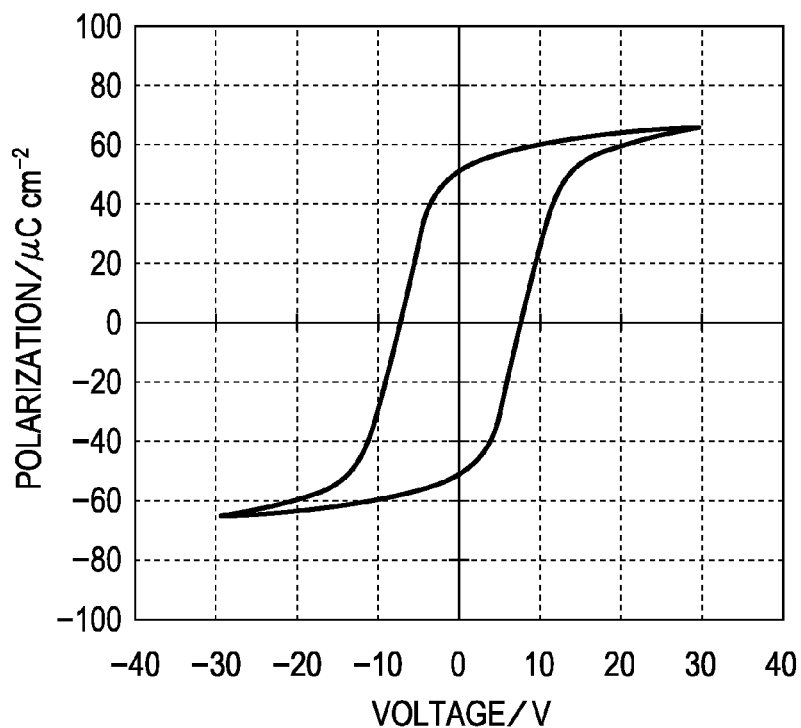
FIG. 13 is a graph showing a P-V curve of a sample 10.
Figure 14:
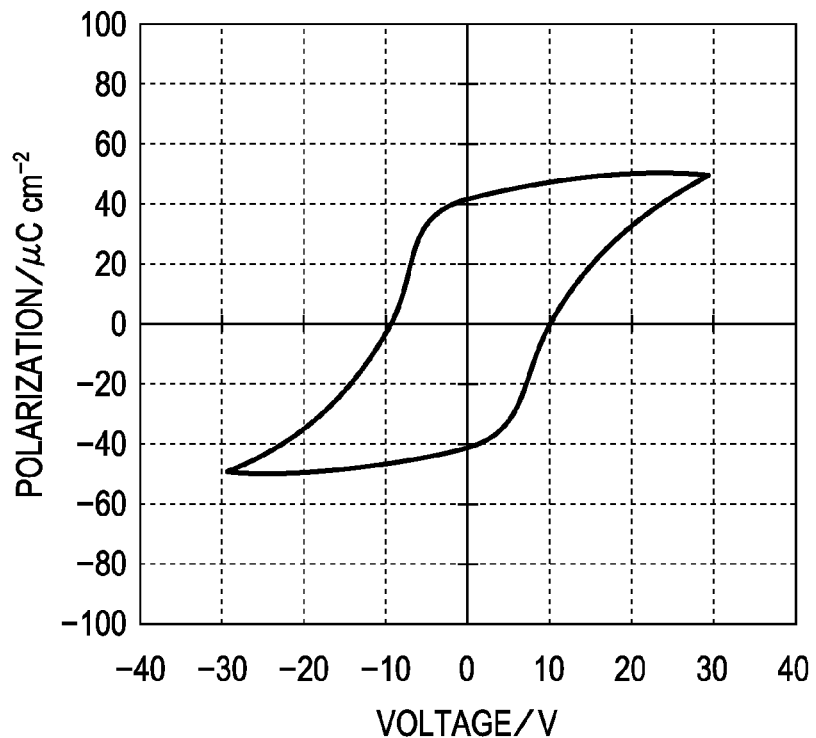
FIG. 14 is a graph showing a P-V curve of a sample 11.

FIG. 1 is a schematic exploded perspective view of an ink jet print head as an example of a liquid-ejecting head manufactured by a method according to a first embodiment of the invention. FIG. 2 is a fragmentary plan view of the print head according to the first embodiment. FIG. 3A is a cross-sectional view of the print head taken along the line IIIA-IIIA of FIG. 2. FIG. 3B is an enlarged cross-sectional view of a principal part of the print head according to the first embodiment.

As illustrated in FIGS. 1 and 3, a flow-passage-forming substrate 10 according to the present embodiment is a silicon single crystal substrate. A silicon dioxide elastic film 50 is disposed on the flow-passage-forming substrate 10.

The flow-passage-forming substrate 10 includes a plurality of pressure-generating chambers 12 juxtaposed to each other in the width direction. The flow-passage-forming substrate 10 further includes a communication portion 13 outside the pressure-generating chambers 12 in the longitudinal direction of the pressure-generating chambers 12. The communication portion 13 communicates with the pressure-generating chambers 12 through corresponding ink feed channels 14 and communication paths 15. The communication portion 13 in communication with a reservoir portion 31 in a protective substrate described below constitutes part of a reservoir, which is a common ink chamber of the pressure-generating chambers 12. The ink feed channels 14 have a smaller width than the pressure-generating chambers 12, producing a constant flow resistance against ink flowing from the communication portion 13 to the pressure-generating chambers 12. While each of the flow passages is narrowed at one side thereof in the present embodiment, each of the flow passages may be narrowed at both sides thereof to form the ink feed channels 14. Alternatively, instead of reducing the width of the flow passages, the thickness of the flow passages may be reduced to form the ink feed channels 14. Thus, the flow-passage-forming substrate 10 includes liquid flow passages, which are composed of the pressure-generating chambers 12, the communication portion 13, the ink feed channels 14, and the communication paths 15.

The bottom surface of the flow-passage-forming substrate 10 is attached to a nozzle plate 20 with an adhesive, a heat-seal film, or the like. The nozzle plate 20 has nozzle openings 21 in communication with the corresponding ends of the pressure-generating chambers 12 opposite the ink feed channels 14. The nozzle plate 20 may be formed of glass ceramic, a silicon single crystal, or stainless steel.

As described above, the elastic film 50 is disposed on the flow-passage-forming substrate 10 opposite the nozzle plate 20. An insulator film 55, for example, formed of zirconium oxide is disposed on the elastic film 50.

A first electrode 60, a piezoelectric layer 70, and a second electrode 80 are formed on the insulator film 55 to constitute a piezoelectric element 300. The piezoelectric layer 70 has a thickness of 2 μm or less, preferably in the range of 0.3 to 1.5 μm. The piezoelectric element 300 refers to a portion that includes the first electrode 60, the piezoelectric layer 70, and the second electrode 80. In general, one of the two electrodes of the piezoelectric element 300 serves as a common electrode, and the other electrode and the piezoelectric layer 70 correspond to each of the pressure-generating chambers 12. In the present embodiment, the first electrode 60 serves as the common electrode for the piezoelectric elements 300 and the second electrodes 80 serve as individual electrodes of the piezoelectric elements 300. Depending on the drive circuitry or wiring, however, first electrodes may serve as individual electrodes and a second electrode may serve as a common electrode. The piezoelectric element 300 in combination with a diaphragm is hereinafter referred to as an actuator. The diaphragm can be deformed by the operation of the piezoelectric element 300. Although the elastic film 50, the insulator film 55, and the first electrode 60 function as the diaphragm in the present embodiment, the diaphragm is not limited to this structure. For example, the ink jet print head I may include no elastic film 50 or insulator film 55, and the first electrode 60 alone may function as the diaphragm. Alternatively, the piezoelectric elements 300 may function as the diaphragm.

In the present embodiment, as illustrated in FIG. 3B, the first electrode 60 includes a first titanium oxide layer 61 containing titanium oxide, a platinum layer 62 containing platinum, and a second titanium oxide layer 63 containing titanium oxide, layered in this order on the insulator film 55. The platinum layer 62 mainly functions as an electroconductive layer. The first titanium oxide layer 61 and the second titanium oxide layer 63 may therefore have low electrical conductivity and may have a non-layer structure, such as an island structure. Preferably, the second titanium oxide layer 63 has a thickness of 3 nm or less. A second titanium oxide layer having a thickness above 3 nm may have a low dielectric constant and consequently low piezoelectricity. The second titanium oxide layer 63 having a thickness of 3 nm or less can improve piezoelectricity.

The piezoelectric layer 70 is formed of a piezoelectric material containing bismuth lanthanum iron-manganese oxide, that is, an $ABO_3$ complex oxide containing bismuth (Bi), lanthanum (La), iron (Fe), and manganese (Mn). In the perovskite $ABO_3$ structure, the A sites have oxygen atoms in 12-fold coordination, and the B sites have oxygen atoms in 6-fold coordination, forming an octahedron. Bi and La are located at the A sites, and Fe and Mn are located at the B sites.

In the piezoelectric layer 70 according to the present embodiment, the integrated intensity of a diffraction peak derived from $ABO_3$ observed at $20°<2\theta<25°$ measured at $\phi=\Phi=0°$ is 90% or more of the sum of the integrated intensities of diffraction peaks derived from $ABO_3$ observed at $20°<2\theta<50°$. Thus, the piezoelectric layer 70 contains crystals preferentially oriented in a (100) plane. While the piezoelectric layer 70 formed of a piezoelectric material containing bismuth lanthanum iron-manganese oxide is novel, the present inventors first found that the piezoelectric layer 70 contains crystals preferentially oriented in the (100) plane. The crystals preferentially oriented in the (100) plane have higher piezoelectricity than randomly oriented crystals. Use of such a piezoelectric element as a piezoelectric actuator can produce a large strain.

Although the details are described below, the piezoelectric element according to the present embodiment is fabricated by using a titanium film as the base of a platinum film formed of a platinum precursor of the platinum layer 62 and firing and crystallizing a piezoelectric precursor film containing bismuth, lanthanum, iron, and manganese on the platinum layer 62 in an inert gas atmosphere. In the piezoelectric layer 70 thus fabricated, the integrated intensity of a diffraction peak derived from $ABO_3$ observed at $20°<2\theta<25°$ measured at $\phi=\Phi=0°$ can be 90% or more of the sum of the integrated intensities of diffraction peaks derived from $ABO_3$ observed at $20°<2\theta<50°$. Thus, the piezoelectric layer 70 can contain crystals preferentially oriented in a (100) plane. Furthermore, in the crystallization of the piezoelectric precursor film, titanium in the base diffuses in the piezoelectric layer through platinum grain boundaries, thereby increasing the insulating capacity of the piezoelectric layer 70.

In the fabrication method described above, the amount of titanium diffusing in the piezoelectric layer 70 is not particularly limited. For example, the titanium content of the piezoelectric layer 70 is approximately 0.1% by mass or more and 0.5% by mass or less.

Firing and crystallizing a piezoelectric precursor film containing bismuth, lanthanum, iron, and manganese formed in the same manner as described above on the platinum film disposed on the titanium film in the air or an oxygen atmosphere does not yield crystals preferentially oriented in the (100) plane but yields randomly orientated crystals.

In the case that the base of the platinum film is titanium oxide and the diffusion of titanium is blocked, firing and crystallizing a piezoelectric precursor film containing bismuth, lanthanum, iron, and manganese even in an inert gas atmosphere does not yield crystals preferentially oriented in the (100) plane but yields randomly orientated crystals.

Figure 15:
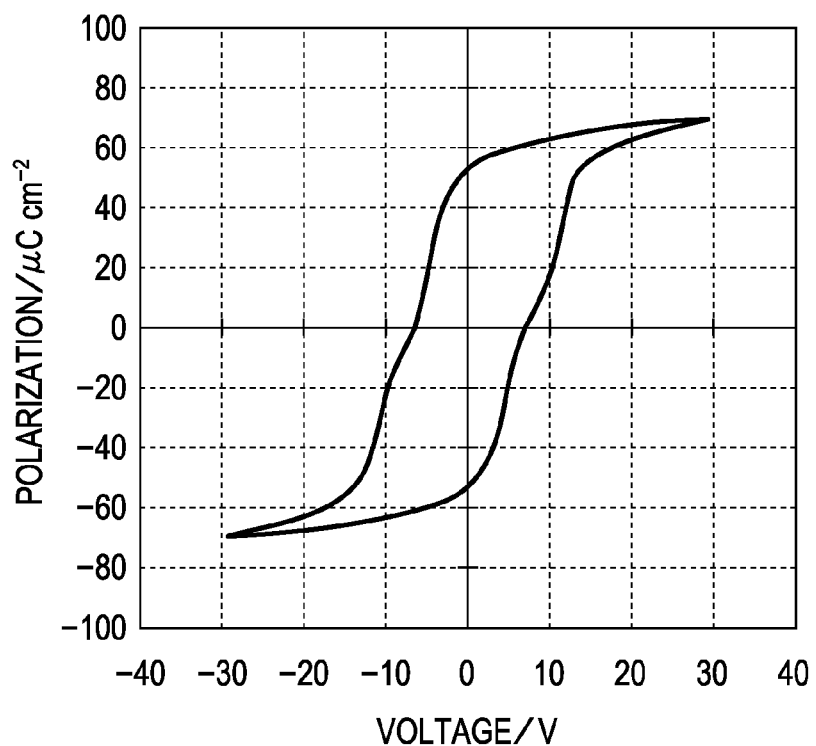
FIG. 15 is a graph showing a P-V curve of a sample 12.
Figure 16:
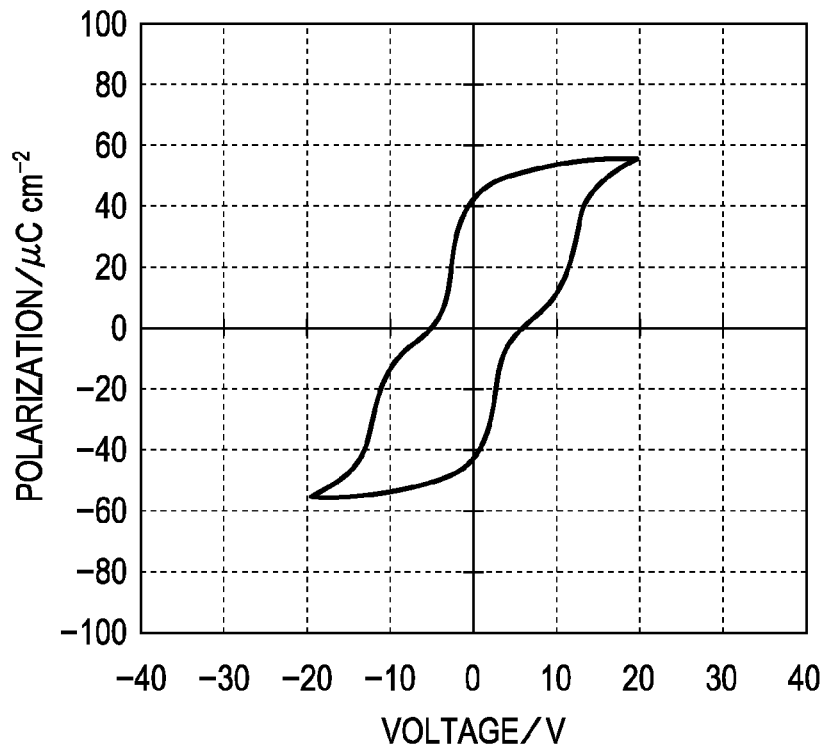
FIG. 16 is a graph showing a P-V curve of a sample 13.
Figure 17:
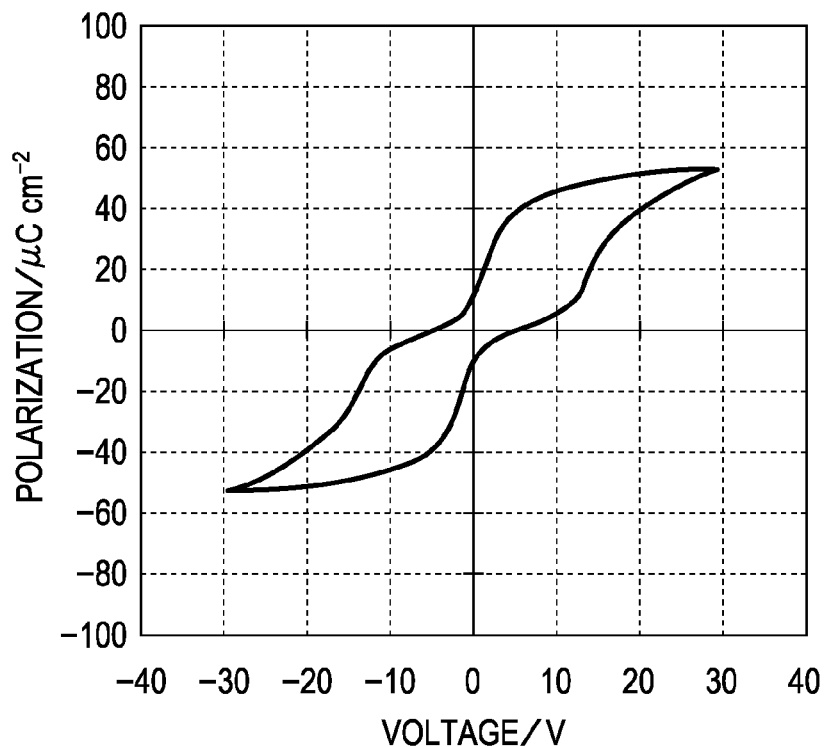
FIG. 17 is a graph showing a P-V curve of a sample 14.
Figure 18:
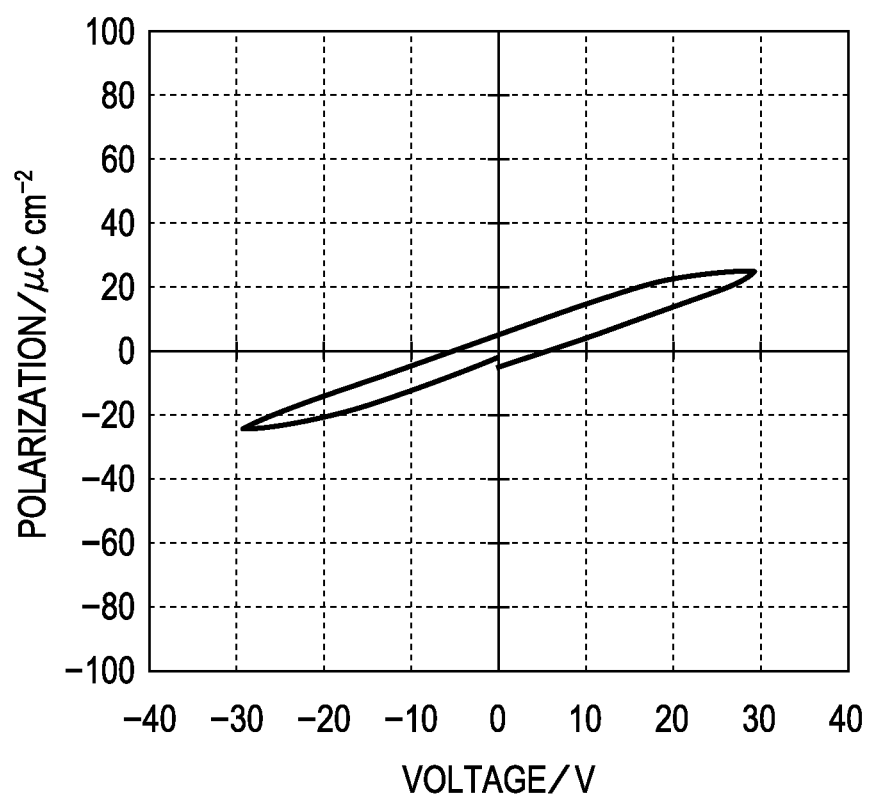
FIG. 18 is a graph showing a P-V curve of a sample 15.

Preferably, the piezoelectric layer 70 containing bismuth (Bi), lanthanum (La), iron (Fe), and manganese (Mn) has a composition expressed by the general formula (1) described below. The piezoelectric layer 70 having a composition expressed by the general formula (1) can be a ferroelectric substance. The piezoelectric layer 70 formed of a ferroelectric substance facilitates the control of the strain of the piezoelectric element. Thus, with a liquid-ejecting head including such a piezoelectric element, the size of ink droplets ejected can be easily controlled. Depending on the composition, an $ABO_3$ complex oxide containing Bi, La, Fe, and Mn exhibited ferroelectric, antiferroelectric, or paraelectric characteristics. Piezoelectric elements (samples 1 to 18) were fabricated, in which the composition of the general formula (1) was altered as shown in Table 1. FIGS. 4 to 18 show the relationship between polarization (P) and voltage (V) when a triangular wave of 25 or 30 V was applied to the samples 1 to 18, respectively. The samples 16 to 18 had too much leakage to determine the relationship and could not be used as piezoelectric materials. As shown in FIGS. 4 to 14, the samples 1 to 11, which satisfied $0.10 \leq x \leq 0.20$ and $0.01 \leq y \leq 0.09$, had a hysteresis loop characteristic of a ferroelectric substance. In the samples 1 to 11, the piezoelectric strain increases linearly with voltage applied and is easy to control. As shown in FIGS. 15 to 17, the samples 12 to 14, which have x and y outside the ranges of 0.10≤x≤0.20 and 0.01≤y≤0.09 in the general formula (1), have double hysteresis in the positive electric field direction and the negative electric field direction, which is characteristic of an antiferroelectric substance. Thus, the samples 12 to 14 are antiferroelectric substances. As shown in FIG. 18, the sample 15 is a paraelectric material. The samples 16 to 18 could not be used as a piezoelectric material because of excessive leakage, as described above. Thus, the samples 12 to 18 are not ferroelectric.

$$(Bi_{1-x}La_x)(Fe_{1-y}Mn_y)O_3 \quad (1)$$

$$(0.10 \leq x \leq 0.20, 0.01 \leq y \leq 0.09)$$

TABLE 1

|  | x | y |
|---|---|---|
| Sample 1 | 0.10 | 0.03 |
| Sample 2 | 0.10 | 0.05 |
| Sample 3 | 0.10 | 0.09 |
| Sample 4 | 0.14 | 0.05 |
| Sample 5 | 0.17 | 0.03 |
| Sample 6 | 0.18 | 0.03 |
| Sample 7 | 0.20 | 0.01 |
| Sample 8 | 0.20 | 0.02 |
| Sample 9 | 0.19 | 0.03 |
| Sample 10 | 0.19 | 0.04 |
| Sample 11 | 0.19 | 0.05 |
| Sample 12 | 0.21 | 0.03 |
| Sample 13 | 0.24 | 0.05 |
| Sample 14 | 0.29 | 0.05 |
| Sample 15 | 0.48 | 0.05 |
| Sample 16 | 0.20 | 0.00 |
| Sample 17 | 0.10 | 0.00 |
| Sample 18 | 0.00 | 0.00 |

An antiferroelectric substance has adjacent dipoles oriented in antiparallel directions and can undergo electric-field-induced phase transition above a certain voltage. A piezoelectric layer formed of such an antiferroelectric substance can produce a larger strain than a piezoelectric layer formed of a ferroelectric substance. However, the piezoelectric layer formed of an antiferroelectric substance cannot be driven below a certain voltage. In addition, piezoelectric strain does not change linearly with voltage. The term "electric-field-induced phase transition" means phase transition induced by an electric field and includes phase transition from an antiferroelectric phase to a ferroelectric phase and phase transition from a ferroelectric phase to an antiferroelectric phase. The term "ferroelectric phase" means that spontaneous polarization occurs unidirectionally. The term "antiferroelectric phase" means that adjacent dipoles are oriented in antiparallel directions. For example, in phase transition from an antiferroelectric phase to a ferroelectric phase, some adjacent dipoles oriented in antiparallel directions in the antiferroelectric phase are inverted such that the dipoles are oriented unidirectionally. Such electric-field-induced phase transition expands or contracts lattices to produce a phase transition strain. A substance that can undergo electric-field-induced phase transition is an antiferroelectric substance. Thus, in an antiferroelectric substance, some adjacent dipoles oriented in antiparallel directions in the absence of an electric field are inverted such that the dipoles are oriented unidirectionally upon the application of an electric field. In a P-V curve showing the amount of polarization P of an antiferroelectric substance as a function of voltage V, the antiferroelectric substance has double hysteresis loops in the positive electric field direction and the negative electric field direction. In regions where the amount of polarization changes drastically, phase transition occurs from a ferroelectric phase to an antiferroelectric phase and from an antiferroelectric phase to a ferroelectric phase.

Unlike the antiferroelectric substance, a ferroelectric substance does not have a double hysteresis in a P-V curve. In the ferroelectric substance, spontaneous polarization occurs unidirectionally, and piezoelectric strain increases linearly with voltage applied. Thus, the ferroelectric substance facilitates the control of piezoelectric strain and the control of droplet size, and a single piezoelectric element can produce both a small amplitude vibration (microvibration) and a large amplitude vibration, which produces a large excluded volume.

Preferably, the piezoelectric layer 70 has an X-ray powder diffraction pattern that includes both a diffraction peak assigned to a ferroelectric phase and a diffraction peak assigned to an antiferroelectric phase. The piezoelectric layer 70 that includes both a diffraction peak assigned to a ferroelectric phase and a diffraction peak assigned to an antiferroelectric phase, that is, includes a morphotropic phase boundary (MPB) between the antiferroelectric phase and the ferroelectric phase provides a piezoelectric element that can produce a large strain. The piezoelectric layer 70 preferably has x in the range of 0.17≤x≤20, more preferably 0.19≤x≤0.20, in the general formula (1). In these ranges, as shown in the examples described below, the X-ray powder diffraction pattern includes both a diffraction peak assigned to a ferroelectric phase and a diffraction peak assigned to an antiferroelectric phase, indicating the coexistence of the antiferroelectric phase and the ferroelectric phase. The MPB between the antiferroelectric phase and the ferroelectric phase provides a piezoelectric element that can produce a large strain.

Each of the second electrodes 80, which are the individual electrodes of the piezoelectric elements 300, is connected to one of lead electrodes 90. Each of the lead electrodes 90 may be formed of gold (Au) and extends from the neighborhood of an end of the ink feed channel 14 to the insulator film 55.

The flow-passage-forming substrate 10 on which the piezoelectric elements 300 are disposed is covered with a protective substrate 30 with an adhesive 35 interposed therebetween. In other words, the first electrode 60, the insulator film 55, and the lead electrode 90 are covered with the protective substrate 30. The protective substrate 30 includes a reservoir portion 31, which constitutes at least part of a reservoir 100. The reservoir portion 31 is disposed in the protective substrate 30 in the thickness direction and extends in the width direction of the pressure-generating chambers 12. As described above, the reservoir portion 31 communicates with the communication portion 13 in the flow-passage-forming substrate 10, constituting the reservoir 100. The reservoir 100 serves as a common ink chamber for the pressure-generating chambers 12. The communication portion 13 in the flow-passage-forming substrate 10 may be divided so as to correspond to each of the pressure-generating chambers 12, and only the reservoir portion 31 may function as a reservoir. Furthermore, for example, the flow-passage-forming substrate 10 may only include the pressure-generating chambers 12, and components between the flow-passage-forming substrate 10 and the protective substrate 30 (such as the elastic film 50 and the insulator film 55) may include ink feed channels 14 connecting the reservoir with the pressure-generating chambers 12.

The protective substrate 30 includes a piezoelectric element housing space 32 opposite to the piezoelectric elements 300. The piezoelectric element housing space 32 does not interfere with the displacement of the piezoelectric elements 300. After ensuring that the walls of the piezoelectric element housing space 32 do not interfere with the displacement of the piezoelectric elements 300, the space may be sealed or not.

The protective substrate 30 is preferably formed of a material having substantially the same thermal expansion coefficient as the flow-passage-forming substrate 10, for example, glass or ceramic material. In the present embodiment, the protective substrate 30 is formed of a silicon single crystal, which is the same material as the flow-passage-forming substrate 10.

The protective substrate 30 includes a through-hole 33 passing through the protective substrate 30 in the thickness direction. The neighborhoods of the ends of the lead electrodes 90 extending from the piezoelectric elements 300 are exposed in the through-hole 33.

A drive circuit 120 for driving the piezoelectric elements 300 is fixed onto the protective substrate 30. The drive circuit 120 is juxtaposed to the piezoelectric elements 300. The drive circuit 120 may be a circuit board or a semiconductor integrated circuit (IC). The drive circuit 120 is electrically connected to the lead electrodes 90 through interconnecting wiring. The interconnecting wiring includes electroconductive wires, such as bonding wires.

The protective substrate 30 is attached to a compliance substrate 40. The compliance substrate 40 includes a sealing film 41 and a fixing sheet 42. The sealing film 41 is formed of a flexible material and seals one side of the reservoir portion 31. The fixing sheet 42 is formed of a relatively hard material. The fixing sheet 42 has an opening 43 on top of the reservoir 100. Thus, one side of the reservoir 100 is sealed with the flexible sealing film 41 alone.

In the ink jet print head I according to the present embodiment, the reservoir 100 to the nozzle openings 21 are filled with ink supplied from an ink inlet connected to an external ink supply unit (not shown). A voltage is applied between the first electrode 60 and the second electrode 80 disposed on the corresponding pressure-generating chamber 12 in response to a print signal from the drive circuit 120 to deform the elastic film 50, the insulator film 55, the first electrode 60, and the piezoelectric layer 70. The deformation increases the internal pressure of the pressure-generating chamber 12, allowing ink droplets to be ejected from the corresponding nozzle opening 21.

A method for manufacturing an ink jet print head according to the present embodiment will be described below with reference to FIGS. 19A to 23B. FIGS. 19A to 23B are longitudinal cross-sectional views of a pressure-generating chamber.

Figure 19A:
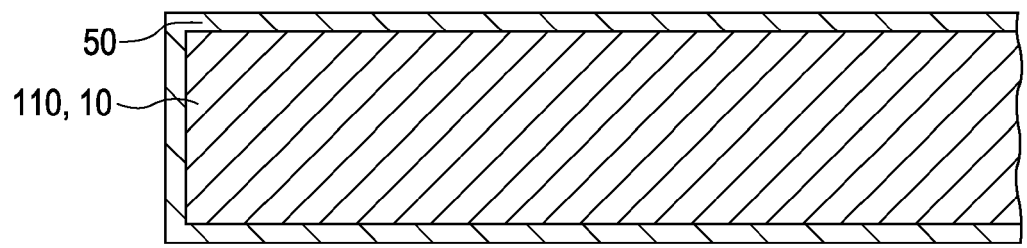
FIG. 19A is a cross-sectional view illustrating a process of manufacturing the print head according to the first embodiment.
Figure 19B:
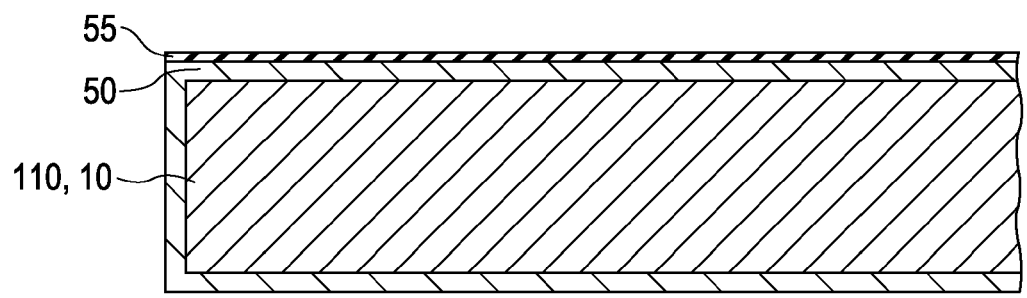
FIG. 19B is a cross-sectional view illustrating a process of manufacturing the print head according to the first embodiment.

As illustrated in FIG. 19A, the surface of a flow-passage-forming substrate wafer 110 formed of silicon may be thermally oxidized to form a silicon dioxide ($SiO_2$) elastic film 50. As illustrated in FIG. 19B, an insulator film 55, for example, formed of zirconium oxide is then formed on the elastic film 50 (silicon dioxide film), for example, by reactive sputtering or thermal oxidation.

Figure 20A:
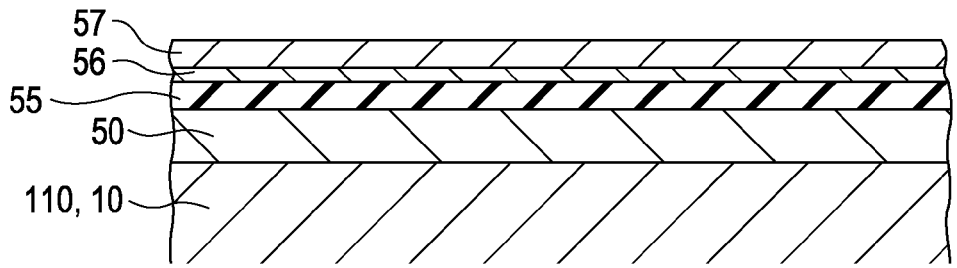
FIG. 20A is a cross-sectional view illustrating a process of manufacturing the print head according to the first embodiment.

As illustrated in FIG. 20A, a titanium film 56 is then formed on the insulator film 55, for example, by DC sputtering or ion sputtering. A platinum film 57 is then formed over the entire surface of the titanium film 56, for example, by DC sputtering. The platinum film 57 is then patterned. A piezoelectric layer 70 is then formed on the platinum film 57. The piezoelectric layer 70 may be formed by any method, including a metal-organic decomposition (MOD) method. In the MOD method, an organometallic compound dissolved or dispersed in a solvent is applied, is dried, and is fired at a high temperature to form the piezoelectric layer 70 formed of a metal oxide. The piezoelectric layer 70 may also be formed by a liquid phase method or a solid phase method, such as a sol-gel method, a laser ablation method, a sputtering method, a pulsed laser deposition (PLD) method, a chemical vapor deposition (CVD) method, or an aerosol deposition method.

Figure 20B:
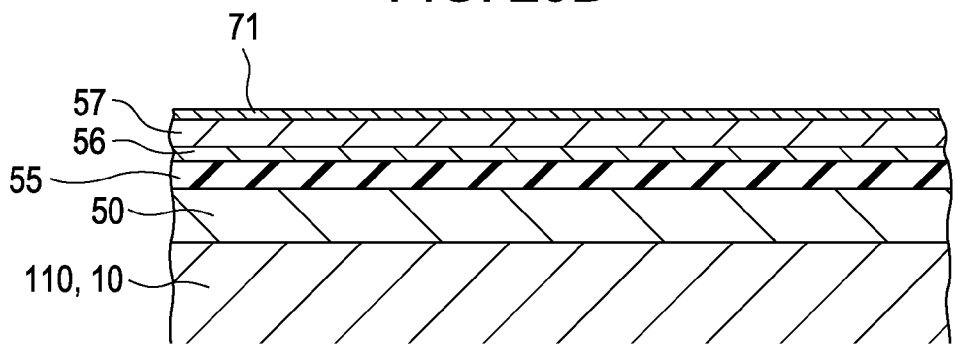
FIG. 20B is a cross-sectional view illustrating a process of manufacturing the print head according to the first embodiment.

As illustrated in FIG. 20B, in specific procedures for forming the piezoelectric layer 70, a sol or an MOD solution (a precursor solution) that contains an organometallic compound, more specifically, an organometallic compound containing bismuth, lanthanum, iron, and manganese at a predetermined ratio is applied to the platinum film 57, for example, by a spin coating method to form a piezoelectric precursor film 71 (a coating step).

The precursor solution is prepared by mixing organometallic compounds containing bismuth, lanthanum, iron, or manganese such that the metals are contained at a desired molar ratio, and dissolving or dispersing the mixture in an organic solvent, such as an alcohol. Examples of the organometallic compounds containing bismuth, lanthanum, iron, or manganese include metal alkoxides, organic acid salts, and β-diketone complexes. An exemplary organometallic compound containing bismuth is bismuth 2-ethylhexanoate. An exemplary organometallic compound containing lanthanum is lanthanum 2-ethylhexanoate. An exemplary organometallic compound containing iron is iron 2-ethylhexanoate. An exemplary organometallic compound containing manganese is manganese 2-ethylhexanoate.

The piezoelectric precursor film 71 is then heated at a predetermined temperature for a predetermined period of time for drying (a drying step). The piezoelectric precursor film 71 thus dried is then heated at a predetermined temperature for a predetermined period of time for degreasing (a degreasing step). The term "degreasing", as used herein, means that organic components contained in the piezoelectric precursor film 71 are removed as $NO_2$, $CO_2$, and/or $H_2O$, for example. The drying step and the degreasing step may be performed in any atmosphere, such as in the air or in an inert gas.

Figure 20C:
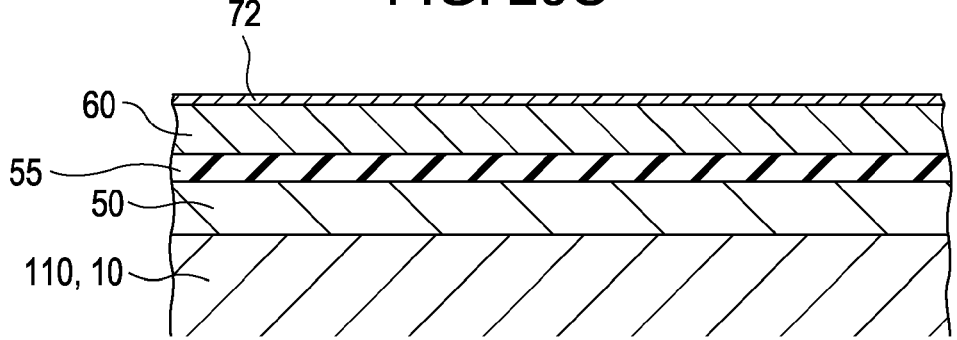
FIG. 20C is a cross-sectional view illustrating a process of manufacturing the print head according to the first embodiment.

As illustrated in FIG. 20C, the piezoelectric precursor film 71 is crystallized in an inert gas atmosphere at a predetermined temperature, for example, in the range of approximately 600° C. to 700° C. for a predetermined period of time to form a piezoelectric film 72 (a firing step).

Examples of a heater used in the drying step, the degreasing step, and the firing step include rapid thermal annealing (RTA) apparatuses and hot plates. RTA involves heating by infrared lamp irradiation.

Figure 21A:
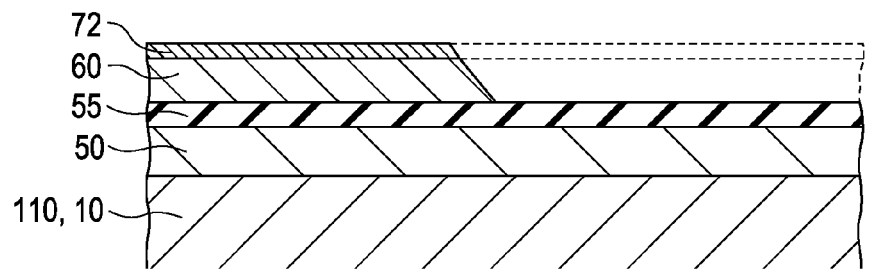
FIG. 21A is a cross-sectional view illustrating a process of manufacturing the print head according to the first embodiment.

As illustrated in FIG. 21A, the first electrode 60 and the (first) piezoelectric film 72 are simultaneously etched so as to have an inclined side surface, using a resist mask (not shown) having a predetermined shape disposed on the piezoelectric film 72.

Figure 21B:
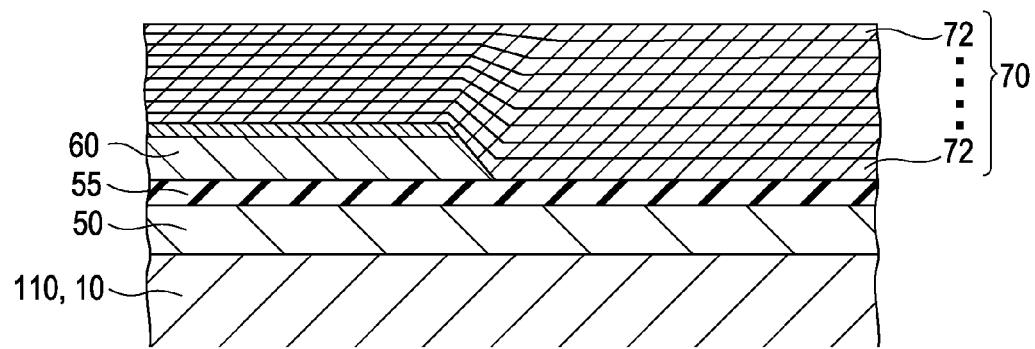
FIG. 21B is a cross-sectional view illustrating a process of manufacturing the print head according to the first embodiment.

Depending on the desired film thickness of the piezoelectric layer 70, after the resist is removed, the coating step, the drying step, the degreasing step, and optionally the firing step may be performed more than once to form the piezoelectric layer 70 composed of a plurality of piezoelectric films 72, as illustrated in FIG. 21B. If the thickness of the piezoelectric film 72 formed by a single application of the coating solution is approximately 0.1 μm, the piezoelectric layer 70 composed of 10 piezoelectric films 72 would have a thickness of approximately 1 μm. Although the piezoelectric film 72 has a layered structure in the present embodiment, the piezoelectric film 72 may be a monolayer.

In the formation of the piezoelectric layer 70, firing of the piezoelectric precursor film 71 for crystallization in an inert gas atmosphere as described above allows titanium in the titanium film 56 to diffuse. The titanium film 56 is disposed on the platinum film 57 (the first electrode 60) adjacent to the flow-passage-forming substrate 10. For example, titanium diffuses in the piezoelectric films 72 of the piezoelectric layer 70. Thus, the piezoelectric layer 70 contains titanium. It is presumed that titanium in the titanium film 56 diffuses in the piezoelectric layer 70 through grain boundaries in the platinum film 57 disposed between the titanium film 56 and the piezoelectric layer 70.

Thus, using the titanium film 56 as the base of the platinum film 57 and heating and crystallizing the piezoelectric precursor film 71 in an inert gas atmosphere allow titanium in the titanium film 56 to diffuse, thereby increasing the insulating capacity of the piezoelectric layer 70 and preventing the generation of leakage current. This can also increase piezoelectric strain. In the piezoelectric layer 70, the integrated intensity of a diffraction peak derived from $ABO_3$ observed at $20°<2\theta<25°$ measured at $\phi=\Phi=0°$ can be 90% or more of the sum of the integrated intensities of diffraction peaks derived from $ABO_3$ observed at $20°<2\theta<50°$. Thus, the piezoelectric layer 70 can contain crystals preferentially oriented in the (100) plane.

In the crystallization of the piezoelectric precursor film 71, the platinum film 57 becomes a platinum layer 62, which may contain titanium or titanium oxide depending on the degree of diffusion of titanium. In the present embodiment, the diffusion of titanium forms a second titanium oxide layer 63 between the platinum layer 62 and the piezoelectric layer 70. Titanium remaining in the titanium film 56 disposed on the platinum layer 62 adjacent to the flow-passage-forming substrate 10 forms a first titanium oxide layer 61. Depending on the degree of diffusion of titanium, the first titanium oxide layer 61 or the second titanium oxide layer 63 may be substantially absent. Although titanium diffuses in the piezoelectric layer 70 in the present embodiment, titanium may diffuse in the interface between the piezoelectric layer 70 and the platinum layer 62, and the piezoelectric layer 70 may contain no titanium.

Figure 22A:
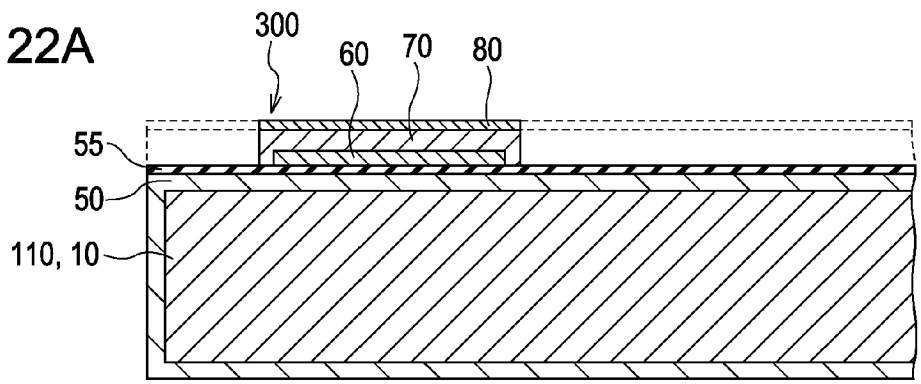
FIG. 22A is a cross-sectional view illustrating a process of manufacturing the print head according to the first embodiment.

The inert gas atmosphere may be the atmosphere of a noble gas, such as helium or argon, an inert gas, such as nitrogen, or a mixture thereof. The inert gas may substitute for the atmosphere in the heater or may flow through the heater. The inert gas concentration may be less than 100% provided that titanium in the titanium film 56 disposed on the platinum film 57 (the first electrode 60) adjacent to the flow-passage-forming substrate 10 can diffuse. For example, the inert gas atmosphere may contain less than 20% oxygen. After the piezoelectric layer 70 is formed, a second electrode 80, for example, formed of platinum is formed on the piezoelectric layer 70 by sputtering, as illustrated in FIG. 22A. The piezoelectric layers 70 and the second electrodes 80 are simultaneously patterned so as to correspond to the pressure-generating chambers 12. The first electrode 60, the piezoelectric layer 70, and the second electrode 80 constitute a piezoelectric element 300. The piezoelectric layers 70 and the second electrodes 80 may be simultaneously dry-etched using a resist mask (not shown) having a predetermined shape. If necessary, post-annealing may be performed at a temperature in the range of 600° C. to 700° C. Post-annealing can provide a good interface between the piezoelectric layer 70 and the first electrode 60 or the second electrode 80 and improve the crystallinity of the piezoelectric layer 70.

Figure 22B:
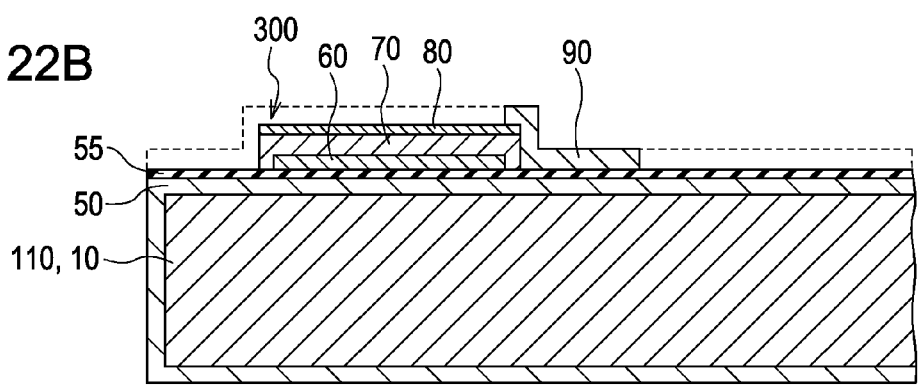
FIG. 22B is a cross-sectional view illustrating a process of manufacturing the print head according to the first embodiment.

As illustrated in FIG. 22B, a lead electrode, for example, formed of gold (Au) is formed over the entire surface of the flow-passage-forming substrate wafer 110. Lead electrodes 90 corresponding to the piezoelectric elements 300 are patterned, for example, using a resist mask (not shown).

Figure 22C:
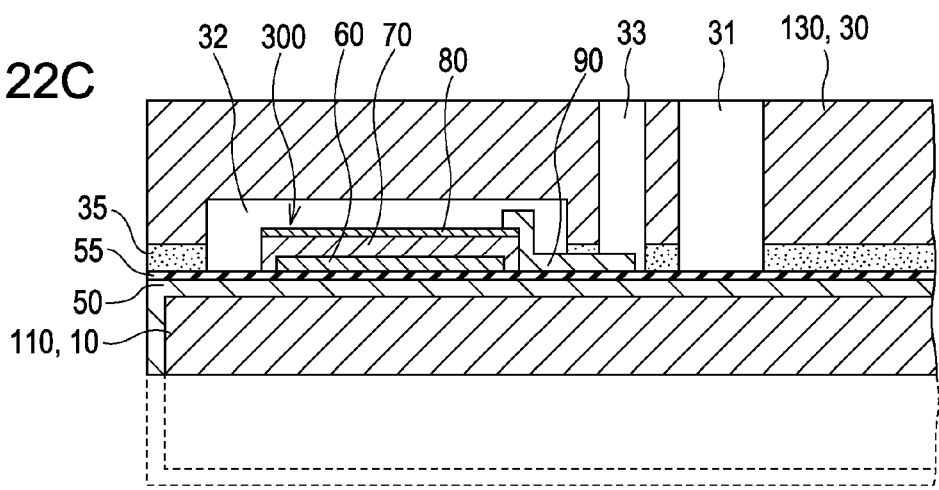
FIG. 22C is a cross-sectional view illustrating a process of manufacturing the print head according to the first embodiment.

As illustrated in FIG. 22C, the piezoelectric elements 300 on the flow-passage-forming substrate wafer 110 are then covered with a protective substrate wafer 130 with an adhesive 35 interposed therebetween. The protective substrate wafer 130 is a silicon wafer and is to become a plurality of protective substrates 30. The thickness of the flow-passage-forming substrate wafer 110 is then reduced to a predetermined thickness.

Figure 23A:
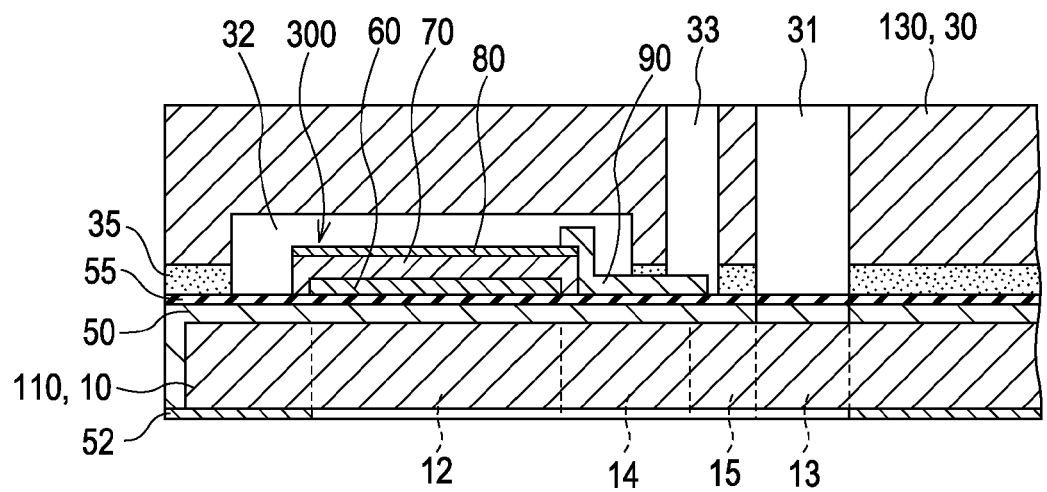
FIG. 23A is a cross-sectional view illustrating a process of manufacturing the print head according to the first embodiment.

As illustrated in FIG. 23A, a mask film 52 is then formed on the flow-passage-forming substrate wafer 110 and is patterned in a predetermined shape.

Figure 23B:
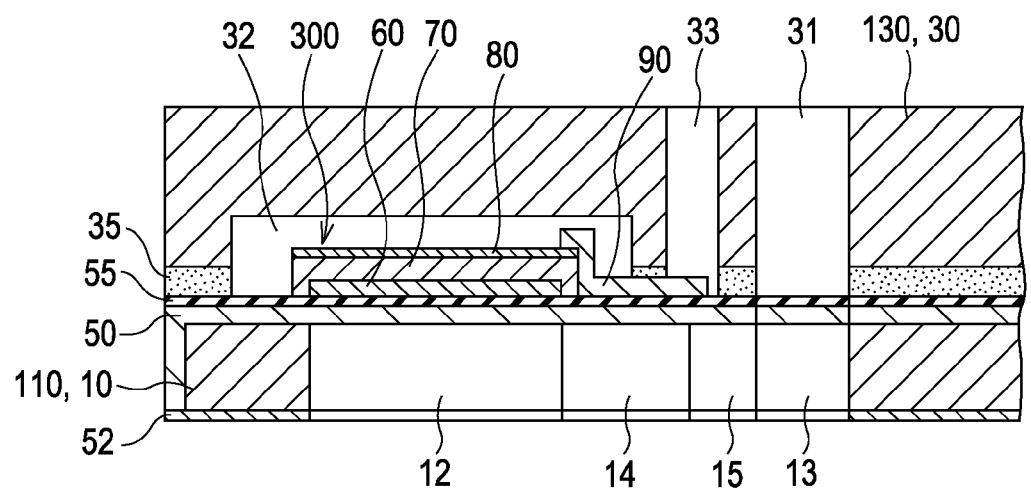
FIG. 23B is a cross-sectional view illustrating a process of manufacturing the print head according to the first embodiment.

As illustrated in FIG. 23B, the flow-passage-forming substrate wafer 110 is then subjected to anisotropic etching (wet etching) with an alkaline solution, such as KOH, through the mask film 52 to form pressure-generating chambers 12 corresponding to the piezoelectric elements 300, a communication portion 13, ink feed channels 14, and communication paths 15.

Subsequently, unnecessary portions on the peripheries of the flow-passage-forming substrate wafer 110 and protective substrate wafer 130 are removed, for example, by cutting, such as dicing. After the mask film 52 on the flow-passage-forming substrate wafer 110 is removed, a nozzle plate 20 having nozzle openings 21 is attached to the flow-passage-forming substrate wafer 110. A compliance substrate 40 is attached to the protective substrate wafer 130. The flow-passage-forming substrate wafer 110 is then divided into flow-passage-forming substrates 10 of a chip size as illustrated in FIG. 1, thus fabricating an ink jet print head I according to the present embodiment.

Another Manufacturing Process

The piezoelectric layer may be formed by another process, in which the integrated intensity of a diffraction peak derived from $ABO_3$ observed at $20°<2\theta<25°$ measured at $\phi=\Phi=0°$ is 90% or more of the sum of the integrated intensities of diffraction peaks derived from $ABO_3$ observed at $20°<2\theta<50°$, that is, crystals are preferentially oriented in the (100) plane.

For example, the piezoelectric layer can contain crystals preferentially oriented in the (100) plane by forming an orientation control layer on the platinum film. More specifically, the piezoelectric layer can contain crystals preferentially oriented in the (100) plane by forming a lanthanum nickel oxide (LNO) film as the orientation control layer on the platinum film, even when a piezoelectric precursor film containing bismuth, lanthanum, iron, and manganese is fired in an inert gas atmosphere or in the air or an oxygen atmosphere for crystallization.

Figure 24:
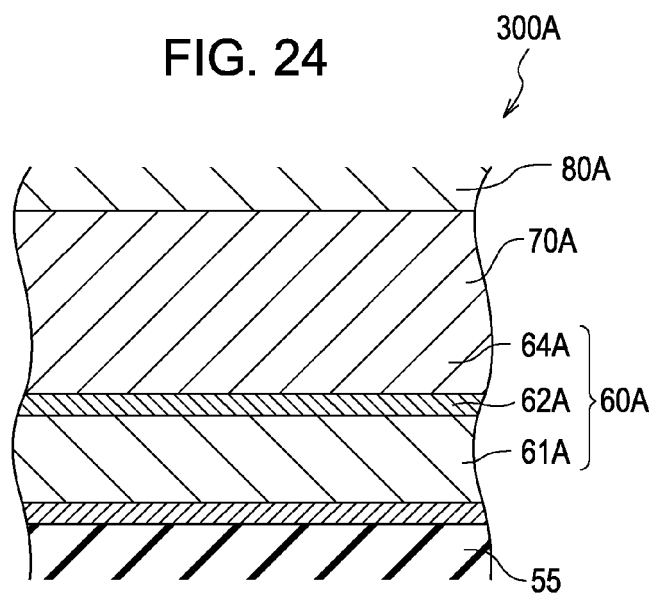
FIG. 24 is a cross-sectional view of a principal part of a piezoelectric element according to a modified example.

FIG. 24 is a cross-sectional view of a principal part of such a piezoelectric element. As illustrated in FIG. 24, a piezoelectric element 300A includes a first electrode 60A, a piezoelectric layer 70A, and a second electrode 80A on the insulator film 55. The first electrode 60A includes a first titanium oxide layer 61A containing titanium oxide, a platinum layer 62A containing platinum disposed on the first titanium oxide layer 61A, and a LNO layer 64A containing lanthanum nickel oxide disposed on the platinum layer 62A. The platinum layer 62A of the first electrode 60A mainly functions as an electroconductive layer. The first titanium oxide layer 61A and the LNO layer 64A may therefore have low electrical conductivity. Depending on the firing conditions and other conditions, titanium before forming the first titanium oxide layer 61A may diffuse in the platinum layer 62A or the interface between the platinum layer 62A and the LNO layer 64A, thereby forming a second titanium oxide layer. However, this second titanium oxide layer does not affect the crystalline orientation of the piezoelectric layer 70A. The insulator film 55 and the first titanium oxide layer 61A are not essential and may be omitted.

The LNO layer 64A may be formed by any method, for example, a sputtering method, a laser ablation method, or a metal-organic chemical vapor deposition (MOCVD) method.

The piezoelectric layer 70A and the second electrode 80A are as described above. The piezoelectric layer 70A is under the influence of the LNO layer 64A acting as the orientation control layer such that the integrated intensity of a diffraction peak derived from $ABO_3$ observed at $20°<2\theta<25°$ measured at $\phi=\Phi=0°$ is 90% or more of the sum of the integrated intensities of diffraction peaks derived from $ABO_3$ observed at $20°<2\theta<50°$, that is, the piezoelectric layer 70A contains crystals preferentially oriented in the (100) plane.

EXAMPLES

The invention will be further described in the following examples. However, the invention is not limited to these examples.

Example 1

A surface of a silicon substrate was thermally oxidized to form a silicon dioxide film. A zirconium oxide film having a thickness of 400 nm was then formed on the silicon dioxide film by RF sputtering. A titanium film having a thickness of 20 nm was then formed on the zirconium oxide film by DC sputtering. A platinum film having a thickness of 130 nm was then formed on the titanium film by DC sputtering.

A piezoelectric layer was then formed on the platinum film by spin coating in the following manner. First, solutions of bismuth 2-ethylhexanoate, lanthanum 2-ethylhexanoate, iron 2-ethylhexanoate, or manganese 2-ethylhexanoate in xylene and octane were mixed at a predetermined ratio to prepare a precursor solution. The precursor solution was dropped onto the substrate on which the platinum film was disposed. The substrate was initially rotated at 500 rpm for five seconds and subsequently 1500 rpm for 30 seconds to form a piezoelectric precursor film (a coating step). Drying and degreasing were then performed in the air at 350° C. for three minutes (a drying and degreasing step). After the coating step and the drying and degreasing step were performed twice, firing was performed by rapid thermal annealing (RTA) at 650° C. for two minutes while nitrogen flowed through a heater at a flow rate of 500 cc/min (a firing step). The two cycles of the coating step and the drying and degreasing step and the single firing step were performed three times (six coating steps in total). Firing by RTA at 650° C. for five minutes while nitrogen flowed through the heater at a flow rate of 500 cc/min yielded a piezoelectric layer having a thickness of 450 nm.

A platinum film having a thickness of 100 nm was formed as a second electrode on the piezoelectric layer by DC sputtering. Firing by RTA at 650° C. for five minutes while nitrogen flowed through the heater at a flow rate of 500 cc/min yielded a piezoelectric element. The piezoelectric element included a piezoelectric layer formed of a complex oxide containing titanium. The piezoelectric element basically had an $ABO_3$ structure expressed by the general formula (1) in which x=0.19 and y=0.03.

Example 2

A piezoelectric element according to Example 2 was formed in the same manner as in Example 1 except that a lanthanum nickel oxide (LNO) layer having a thickness of 50 nm was formed on a platinum film by RF sputtering. For comparison purposes, a piezoelectric element including a LNO layer having a thickness of 10 nm was also fabricated.

Comparative Example 1

The procedures described in Example 1 were performed except that RTA was performed while oxygen flowed through a heater at a flow rate of 500 cc/min.

Comparative Example 2

The procedures described in Example 1 were performed except that a titanium oxide film in place of the titanium film was formed on the zirconium oxide film and a piezoelectric layer was formed on the titanium oxide film.

Test Example 1

Figure 25:
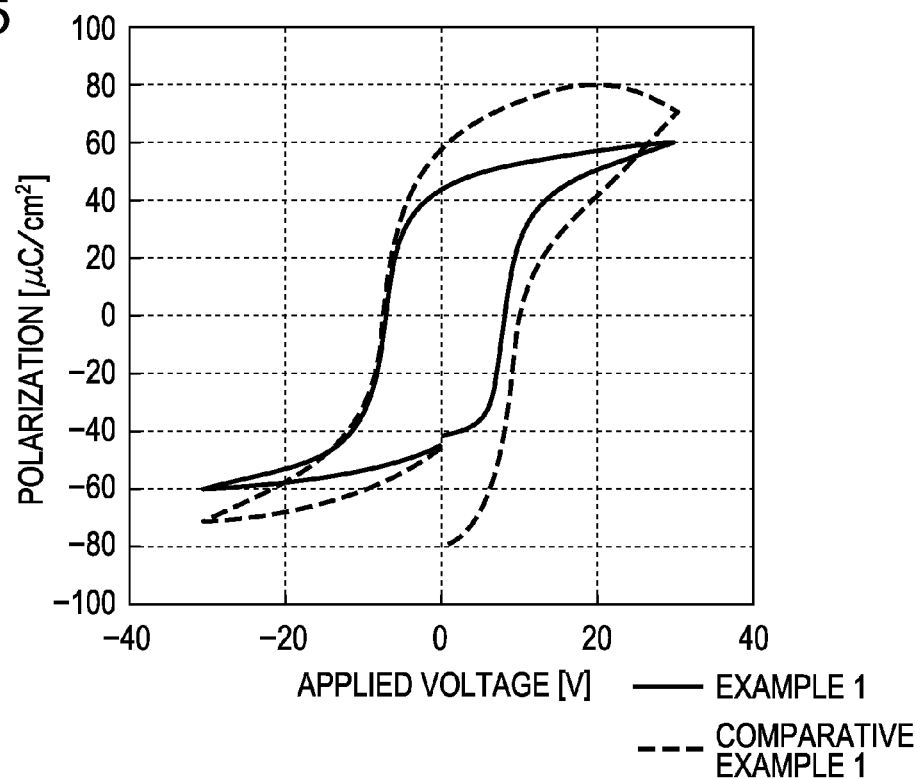
FIG. 25 is a graph showing P-V curves of Example 1 and Comparative Example 1.
Figure 26:
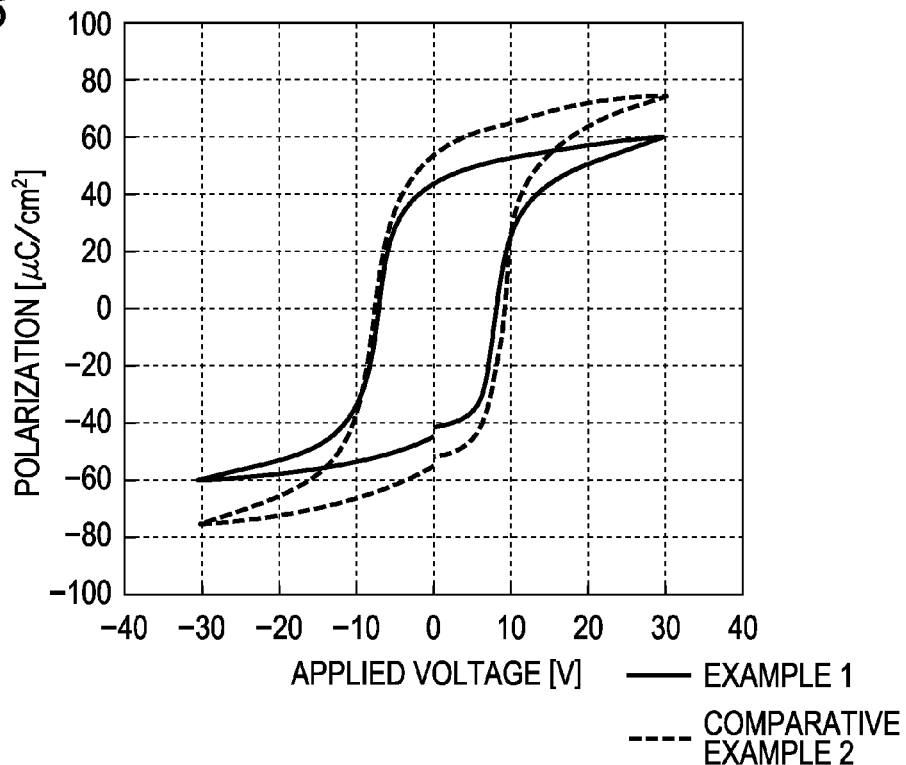
FIG. 26 is a graph showing P-V curves of Example 1 and Comparative Example 2.

The relationship between the amount of polarization and voltage (P-V curve) for the piezoelectric elements according to Example 1 and Comparative Examples 1 and 2 was determined using a triangular wave at a frequency of 1 kHz in a ferroelectric test system "FCE-1A" manufactured by Toyo Co. with an electrode pattern of $\phi=400$ μm. FIGS. 25 and 26 show the results. For comparison purposes, both FIG. 25 and FIG. 26 show the results for Example 1.

FIGS. 25 and 26 show that the piezoelectric element according to Example 1 in which crystals were preferentially oriented in the (100) plane had an excellent hysteresis loop, indicating excellent piezoelectricity and no leakage current. In contrast, the piezoelectric elements according to Comparative Example 1, in which the piezoelectric precursor film was crystallized in the oxygen atmosphere, and Comparative Example 2, in which the base of the platinum film was the titanium oxide film in place of the titanium film, had poor piezoelectricity and generated leakage current.

Test Example 2

Figure 27:
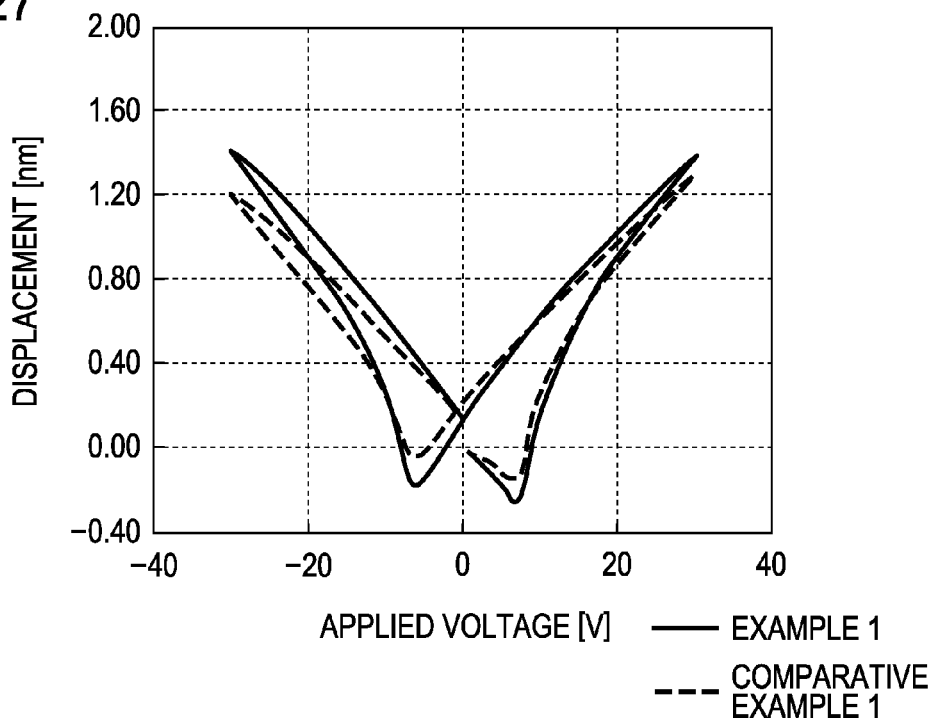
FIG. 27 is a graph showing S-V curves of Example 1 and Comparative Example 1.

The relationship between electric-field-induced strain and electric field strength (S-V curve) for the piezoelectric elements according to Example 1 and Comparative Example 1 was determined at room temperature with a double-beam laser interferometer (DBLI) manufactured by aixACCT Systems using an electrode pattern of $\phi=500$ μm at a frequency of 1 kHz. FIG. 27 shows the results.

As illustrated in FIG. 27, the piezoelectric element according to Example 1 in which crystals were preferentially oriented in the (100) plane exhibited larger displacements and better piezoelectricity than the piezoelectric element according to Comparative Example 1 having a random orientation. FIG. 27 also shows that the piezoelectric element according to Example 1 exhibited a large electric-field-induced strain, was a ferroelectric substance, and, unlike antiferroelectric substances, had a substantially linear relationship between voltage and strain.

Test Example 3

Figure 28:
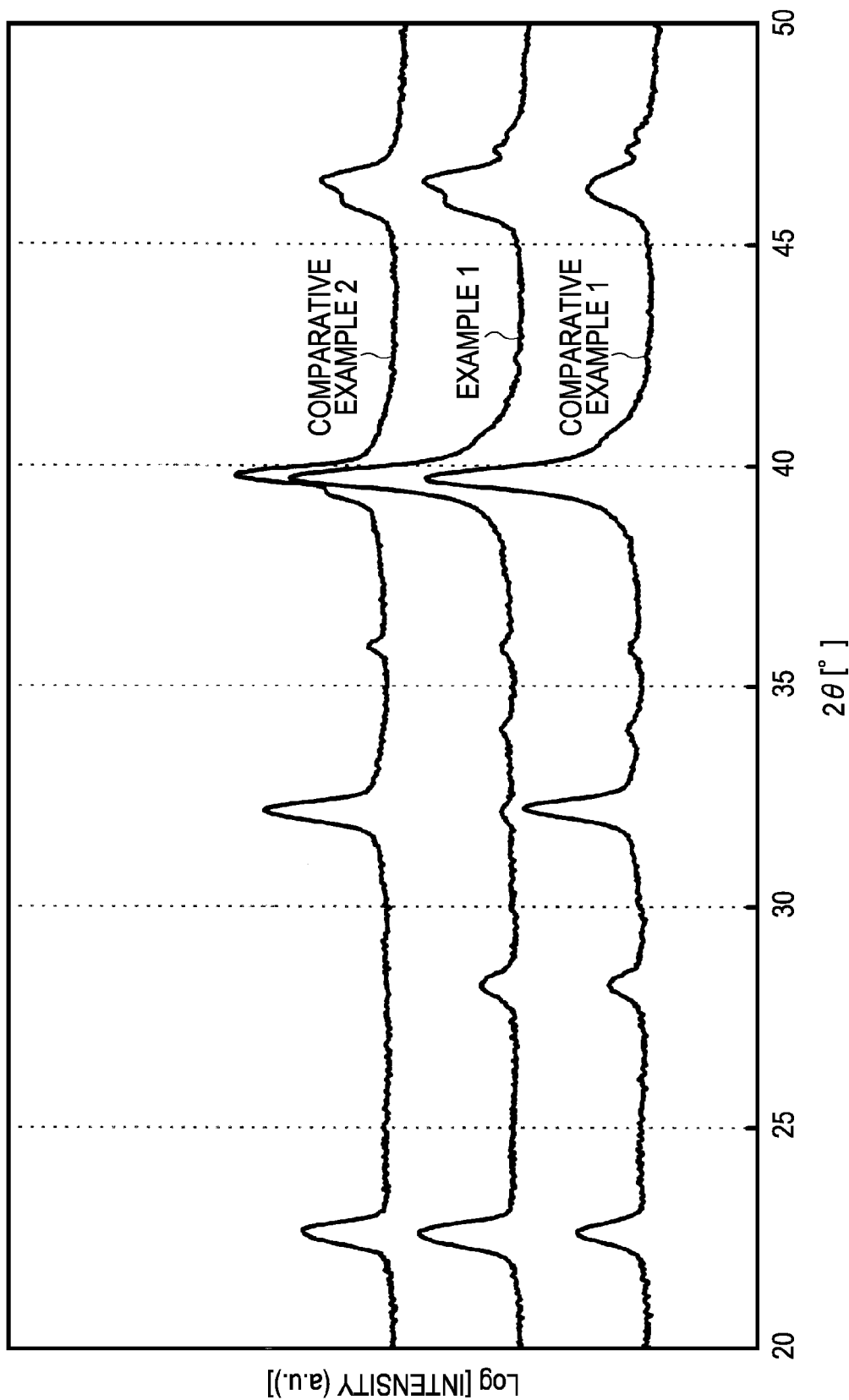
FIG. 28 is a graph showing X-ray diffraction patterns of Example 1 and Comparative Examples 1 and 2.

The X-ray powder diffraction patterns of the piezoelectric layers of the piezoelectric elements according to Example 1 and Comparative Examples 1 and 2 were measured at room temperature and $\phi=\Phi=0°$ with an X-ray diffractometer "D8 Discover" manufactured by Bruker AXS using a CuKα line as an X-ray source. FIG. 28 shows the results for Example 1 and Comparative Examples 1 and 2.

FIG. 28 shows that the X-ray powder diffraction pattern depends on the RTA atmosphere, the material of the base of the platinum film serving as the first electrode, and whether the first electrode is formed of platinum or another material. FIG. 28 also shows that crystals were preferentially oriented in the (100) plane only in Example 1. More specifically, only in Example 1, the integrated intensity of a diffraction peak derived from ABO$_3$ observed at 20°<2θ<25° was 90% or more of the sum of the integrated intensities of diffraction peaks derived from ABO$_3$ observed at 20°<2θ<50°, and crystals were preferentially oriented in the (100) plane. Diffraction peaks derived from ABO$_3$ were observed in Example 1 and Comparative Examples 1 and 2, indicating that the piezoelectric layers of Example 1 and Comparative Examples 1 and 2 had an ABO$_3$ structure.

As shown in FIG. 28, the piezoelectric element according to Example 1 had a diffraction peak at approximately 2θ=46.1° indicative of the presence of a ferroelectric phase and a diffraction peak around 2θ=46.5° indicative of the presence of an antiferroelectric phase. This indicates that the piezoelectric element according to Example 1 had a morphotropic phase boundary (MPB) at which a structure derived from a ferroelectric substance and a structure derived from an antiferroelectric substance coexist.

Figure 29:
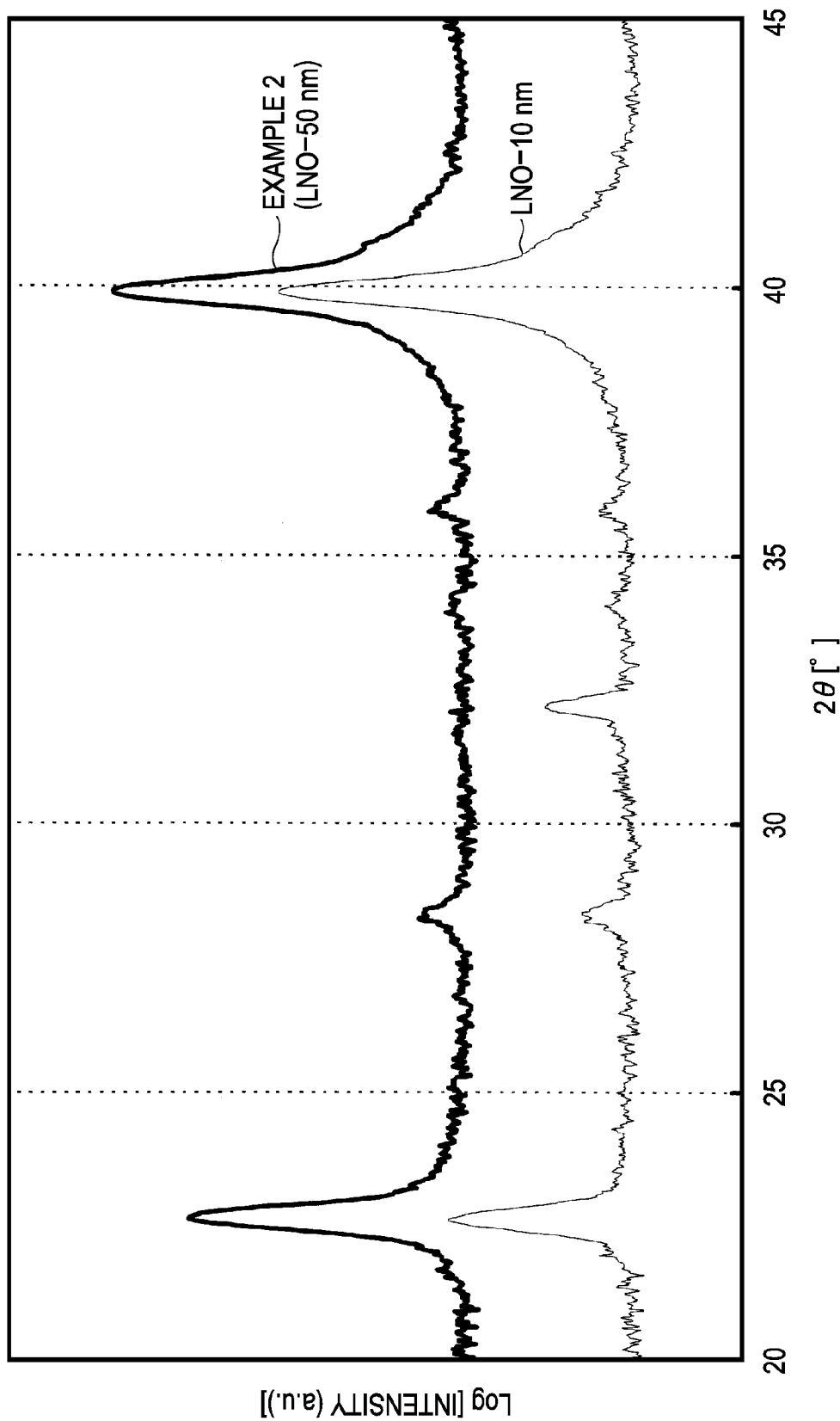
FIG. 29 is a graph showing X-ray diffraction patterns of Example 2 and Comparative Example.

FIG. 29 shows the X-ray powder diffraction pattern of the piezoelectric layer according to Example 2 at φ=Φ=0°.

As shown in FIG. 29, it is preferable that the LNO layer have a thickness of 50 nm or more to increase the degree of (100) orientation.

Other Embodiments

While the embodiments of the invention are described above, the basic constituent features of the invention are not limited to these embodiments. For example, although the basic component of the piezoelectric layer is the ABO$_3$ complex oxide only containing Bi, La, Fe, and Mn as metallic elements in the embodiments described above, the ABO$_3$ complex oxide may further contain another metal to improve the piezoelectric characteristics.

Furthermore, although the flow-passage-forming substrate 10 is a silicon single crystal substrate in the embodiments described above, the flow-passage-forming substrate 10 may be an SOI substrate or a glass substrate.

Furthermore, although the piezoelectric element 300 includes the first electrode 60, the piezoelectric layer 70, and the second electrode 80 on the substrate (the flow-passage-forming substrate 10) in the embodiments described above, a piezoelectric material and an electrode-forming material may be alternately stacked to manufacture a longitudinal vibration piezoelectric element, which expands and contracts in the axial direction.

Figure 30:
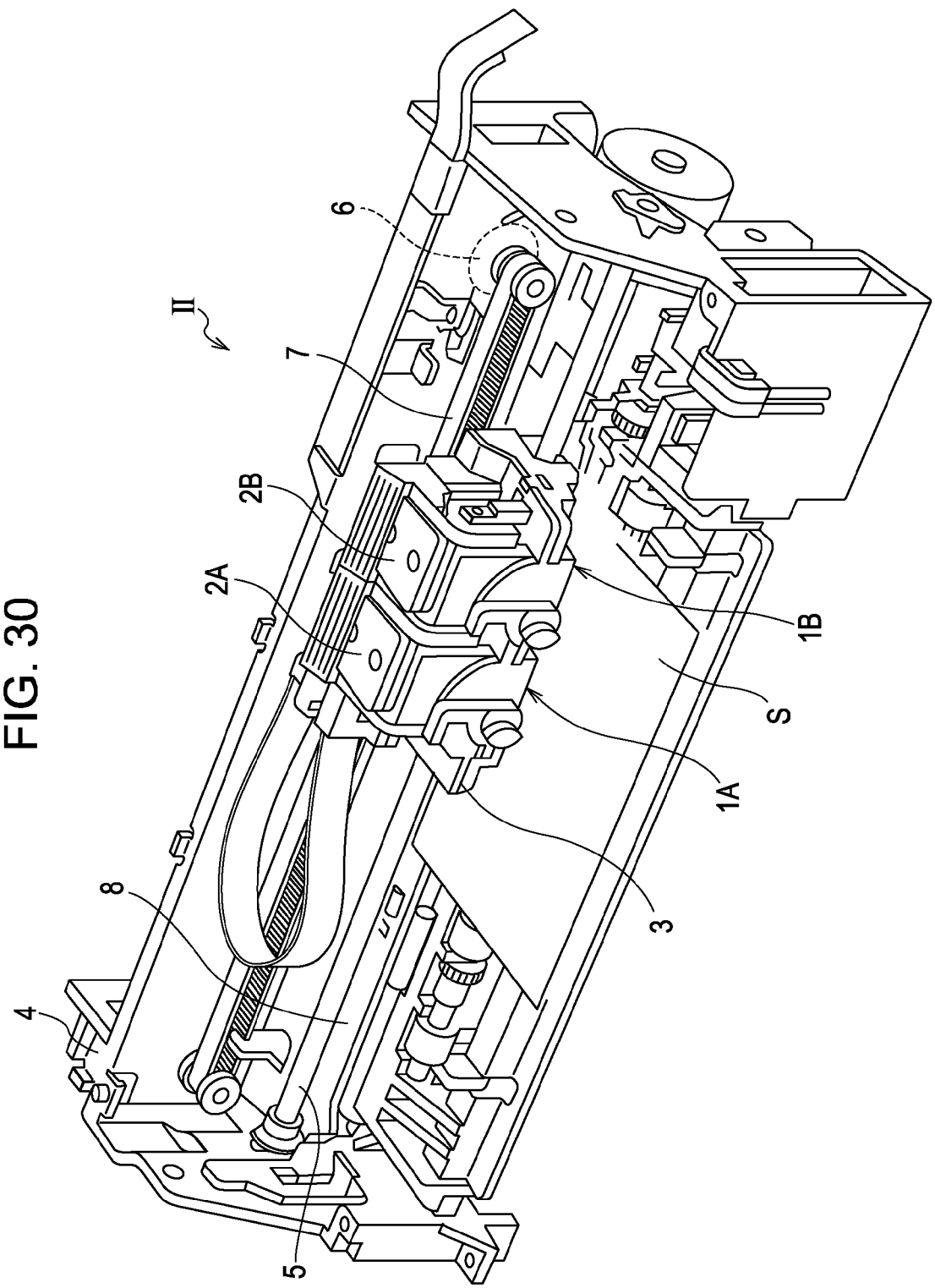
FIG. 30 is a schematic view of a printer according to one embodiment of the invention.

The ink jet print heads according to the embodiments described above can be installed in ink jet printers as one component of a print head unit that includes an ink path in communication with an ink cartridge. FIG. 30 is a schematic view of an ink jet printer according to an embodiment of the invention.

In an ink jet printer II illustrated in FIG. 30, print head units 1A and 1B include the ink jet print head I and house removable cartridges 2A and 2B. Each of the cartridges 2A and 2B constitutes an ink supply unit. A carriage 3 includes the print head units 1A and 1B and is mounted on a carriage shaft 5 attached to a main body 4 of the printer. The carriage 3 can move in the axial direction. For example, the print head units 1A and 1B can eject a black ink composition and a color ink composition, respectively.

When the driving force of a drive motor 6 is transferred to the carriage 3 via a plurality of gears (not shown) and a timing belt 7, the carriage 3 including the print head units 1A and 1B moves along the carriage shaft 5. The main body 4 of the printer includes a platen 8 along the carriage shaft 5. A sheet S, which is a recording medium, such as a paper sheet, can be fed by a feed roller (not shown) and transported over the platen 8.

While the ink jet print head has been described as an example of a liquid-ejecting head in the first embodiment, the invention is directed to a wide variety of general liquid-ejecting heads and, as a matter of course, can be applied to liquid-ejecting heads for ejecting liquid other than ink. Examples of other liquid-ejecting heads include recording heads for use in image recorders, such as printers, coloring-material-ejecting heads for use in the manufacture of color filters for liquid crystal displays, electrode-material-ejecting heads for use in the formation of electrodes for organic EL displays and field-emission displays (FED), and bioorganic-compound-ejecting heads for use in the manufacture of biochips.

The invention can be applied not only to piezoelectric elements installed in liquid-ejecting heads, such as ink jet print heads, but also to piezoelectric elements installed in other apparatuses, for example, ultrasonic devices, such as ultrasonic transmitters, ultrasonic motors, and pressure sensors.

What is claimed is:

1. A piezoelectric element comprising:
   a first electrode,
   a piezoelectric layer which includes bismuth, lanthanum iron, and manganese and which formed above the first electrode; and
   a second electrode formed above the piezoelectric layer,
   wherein the integrated intensity of a diffraction peak observed at 20°<2θ<25° is 90% or more of the sum of the integrated intensities of diffraction peaks observed at 20°<2θ<50° in an X-ray powder diffraction pattern of the piezoelectric layer measured at φ=Φ=0°.

2. The piezoelectric element according to claim 1, wherein the first electrode includes a first titanium oxide layer containing titanium oxide, a platinum layer containing platinum disposed on the first titanium oxide layer, and a second titanium oxide layer containing titanium oxide disposed on the platinum layer, and the piezoelectric layer is disposed on the second titanium oxide layer.

3. The piezoelectric element according to claim 1, wherein the first electrode includes a platinum layer containing platinum and a lanthanum nickel oxide (LNO) layer containing lanthanum nickel oxide disposed on the platinum layer, the LNO layer having a thickness of 50 nm or more, and the piezoelectric layer is disposed on the LNO layer.

4. The piezoelectric element according to claim 1, wherein the bismuth lanthanum iron-manganese oxide is a complex oxide having the following general formula $$(Bi_{1-x}La_x)(Fe_{1-y}Mn_y)O_3 \quad (1)$$

5. The piezoelectric element according to claim 4, wherein the x is in the range of 0.17≤x≤0.20.

6. The piezoelectric element according to claim 5, wherein the x is in the range of 0.19≤x≤0.20.

7. The piezoelectric element according to claim 4, wherein the y is in the range of 0.01≤y≤0.05.

8. A liquid-ejecting head comprising the piezoelectric element according to claim 1.

9. A liquid-ejecting apparatus comprising the liquid-ejecting head according to claim 8.

* * * * *